(12) United States Patent
Dmitriev et al.

(10) Patent No.: US 8,647,435 B1
(45) Date of Patent: Feb. 11, 2014

(54) HVPE APPARATUS AND METHODS FOR GROWTH OF P-TYPE SINGLE CRYSTAL GROUP III NITRIDE MATERIALS

(75) Inventors: Vladimir A. Dmitriev, Gaithersburg, MD (US); Oleg V. Kovalenkov, Montgomery Village, MD (US); Vladimir Ivantsov, Beltsville, MD (US); Lisa Shapovalov, Gaithersburg, MD (US); Alexander L. Syrkin, Montgomery Village, MD (US); Anna Volkova, Gaithersburg, MD (US); Vladimir Sizov, Gaithersburg, MD (US); Alexander Usikov, Gaithersburg, MD (US); Vitali A. Soukhoveev, Gaithersburg, MD (US)

(73) Assignee: Ostendo Technologies, Inc., Carlsbad, CA (US)

(*) Notice: Subject to any disclaimer, the term of this patent is extended or adjusted under 35 U.S.C. 154(b) by 1603 days.

(21) Appl. No.: 11/871,099

(22) Filed: Oct. 11, 2007

Related U.S. Application Data

(60) Provisional application No. 60/829,093, filed on Oct. 11, 2006.

(51) Int. Cl.
*C30B 21/02* (2006.01)

(52) U.S. Cl.
USPC .............. 117/106; 117/89; 117/105; 117/109

(58) Field of Classification Search
USPC .................... 117/105, 106, 109, 89
See application file for complete search history.

(56) References Cited

U.S. PATENT DOCUMENTS

| | | | |
|---|---|---|---|
| 3,836,408 | A | 9/1974 | Kasano |
| 3,865,655 | A | 2/1975 | Pankove |
| 4,144,116 | A | 3/1979 | Jacob et al. |
| 4,190,470 | A | 2/1980 | Walline |
| 4,268,842 | A | 5/1981 | Jacob et al. |
| 4,419,179 | A | 12/1983 | Nogami |
| 5,074,954 | A | 12/1991 | Nishizawa |
| 5,076,860 | A | 12/1991 | Ohba et al. |
| 5,322,592 | A | 6/1994 | Beckers et al. |
| 5,334,250 | A | 8/1994 | Mikami et al. |
| 5,360,760 | A | 11/1994 | Hayashi |

(Continued)

FOREIGN PATENT DOCUMENTS

| | | |
|---|---|---|
| EP | 1200652 | 5/2002 |
| JP | 54-112790 | 9/1979 |

(Continued)

OTHER PUBLICATIONS

Final Office Action dated Oct. 27, 2010 for U.S. Appl. No. 11/871,109, filed Oct. 11, 2007, Inventor: Vladimir A. Dmitriev, (12 pages).

(Continued)

*Primary Examiner* — Bob M Kunemund
(74) *Attorney, Agent, or Firm* — Blakely Sokoloff Taylor & Zafman LLP

(57) ABSTRACT

HVPE reactors and methods for growth of p-type group III nitride materials including p-GaN. A reaction product such as gallium chloride is delivered to a growth zone inside of a HVPE reactor by a carrier gas such as Argon. The gallium chloride reacts with a reactive gas such as ammonia in the growth zone in the presence of a magnesium-containing gas to grow p-type group III nitride materials. The source of magnesium is an external, non-metallic compound source such as Cp2Mg.

12 Claims, 20 Drawing Sheets

(56) References Cited

U.S. PATENT DOCUMENTS

| | | | |
|---|---|---|---|
| 5,679,152 A | 10/1997 | Tischler et al. |
| 5,770,887 A | 6/1998 | Tadatomo et al. |
| 5,875,769 A | 3/1999 | Toyama et al. |
| 5,935,321 A | 8/1999 | Chiou et al. |
| 5,993,542 A | 11/1999 | Yanashima et al. |
| 6,001,712 A | 12/1999 | Yamauchi |
| 6,001,748 A | 12/1999 | Tanaka et al. |
| 6,006,738 A | 12/1999 | Itoh et al. |
| 6,056,817 A | 5/2000 | Uchida et al. |
| 6,110,290 A | 8/2000 | Maeda |
| 6,110,809 A | 8/2000 | Sze et al. |
| 6,113,985 A | 9/2000 | Suscavage et al. |
| 6,136,093 A | 10/2000 | Shiomi et al. |
| 6,139,631 A | 10/2000 | Kato |
| 6,146,457 A | 11/2000 | Solomon |
| 6,156,581 A | 12/2000 | Vaudo et al. |
| 6,177,292 B1 | 1/2001 | Hong et al. |
| 6,177,688 B1 | 1/2001 | Linthicum et al. |
| 6,218,269 B1 | 4/2001 | Nikolaev et al. |
| 6,218,280 B1 | 4/2001 | Kryliouk et al. |
| 6,337,102 B1 | 1/2002 | Forrest et al. |
| 6,355,107 B1 | 3/2002 | Solomon et al. |
| 6,372,041 B1 | 4/2002 | Cho et al. |
| 6,406,540 B1 | 6/2002 | Harris et al. |
| 6,447,604 B1 | 9/2002 | Flynn et al. |
| 6,472,300 B2 | 10/2002 | Nikolaev et al. |
| 6,476,420 B2 | 11/2002 | Nikolaev et al. |
| 6,479,839 B2 | 11/2002 | Nikolaev et al. |
| 6,533,874 B1 | 3/2003 | Vaudo et al. |
| 6,555,452 B2 | 4/2003 | Nikolaev et al. |
| 6,559,038 B2 | 5/2003 | Nikolaev et al. |
| 6,559,467 B2 | 5/2003 | Nikolaev et al. |
| 6,562,124 B1 | 5/2003 | Ivantzov et al. |
| 6,573,164 B2 | 6/2003 | Tsvetkov et al. |
| 6,576,054 B1 | 6/2003 | Melnik et al. |
| 6,576,571 B2 | 6/2003 | Biwa et al. |
| 6,579,359 B1 | 6/2003 | Mynbaeva et al. |
| 6,596,079 B1 | 7/2003 | Vaudo et al. |
| 6,599,133 B2 | 7/2003 | Nikolaev et al. |
| 6,613,143 B1 | 9/2003 | Melnik et al. |
| 6,616,757 B1 | 9/2003 | Melnik et al. |
| 6,656,272 B2 | 12/2003 | Tsvetkov et al. |
| 6,656,285 B1 | 12/2003 | Melnik et al. |
| 6,660,083 B2 | 12/2003 | Tsvetkov et al. |
| 6,706,119 B2 | 3/2004 | Tsvetkov et al. |
| 6,765,240 B2 | 7/2004 | Tischler et al. |
| 6,849,862 B2 | 2/2005 | Nikolaev et al. |
| 6,890,809 B2 | 5/2005 | Karpov et al. |
| 6,936,357 B2 | 8/2005 | Melnik et al. |
| 6,943,095 B2 | 9/2005 | Vaudo et al. |
| 6,955,719 B2 | 10/2005 | Dmitriev et al. |
| 6,958,093 B2 | 10/2005 | Vaudo et al. |
| 7,279,047 B2 | 10/2007 | Melnik et al. |
| 7,501,023 B2 | 3/2009 | Dmitriev et al. |
| 7,556,688 B2 | 7/2009 | Melnik et al. |
| 7,611,586 B2 | 11/2009 | Melnik et al. |
| 7,727,333 B1 | 6/2010 | Syrkin et al. |
| 2002/0004254 A1 | 1/2002 | Miki et al. |
| 2002/0017650 A1 | 2/2002 | Nikolaev et al. |
| 2002/0028565 A1 | 3/2002 | Nikolaev et al. |
| 2002/0047135 A1 | 4/2002 | Nikolaev et al. |
| 2002/0155713 A1 | 10/2002 | Tsvetkov et al. |
| 2002/0174833 A1 | 11/2002 | Tsvetkov et al. |
| 2003/0049898 A1 | 3/2003 | Karpov et al. |
| 2003/0205193 A1 | 11/2003 | Melnik et al. |
| 2005/0142391 A1 | 6/2005 | Dmitriev et al. |
| 2005/0164044 A1 | 7/2005 | Melnik et al. |
| 2005/0212001 A1 | 9/2005 | Melnik et al. |
| 2005/0244997 A1 | 11/2005 | Melnik et al. |
| 2006/0011135 A1 | 1/2006 | Dmitriev et al. |
| 2006/0280668 A1 | 12/2006 | Dmitriev et al. |
| 2007/0032046 A1 | 2/2007 | Dmitriev et al. |
| 2008/0022926 A1 | 1/2008 | Melnik et al. |
| 2008/0257256 A1 | 10/2008 | Melnik et al. |
| 2009/0050913 A2 | 2/2009 | Melnik et al. |
| 2009/0092815 A1 | 4/2009 | Dmitriev et al. |
| 2009/0130781 A1 | 5/2009 | Dmitriev et al. |
| 2009/0286063 A2 | 11/2009 | Dmitriev et al. |
| 2009/0286331 A2 | 11/2009 | Dmitriev et al. |

FOREIGN PATENT DOCUMENTS

| | | |
|---|---|---|
| JP | 60065798 | 4/1985 |
| JP | 60-250619 | 12/1985 |
| JP | 07-045538 | 2/1995 |
| JP | 8335555 | 12/1996 |
| KR | 2003-0004231 | 1/2003 |
| WO | WO 00/68470 | 11/2000 |

OTHER PUBLICATIONS

Sukoveyev et al., "GaN 20-mm diameter Ingots grown from melt-solutions by seeded technique," Mat. Res. Soc. Symp., 2000, pp. W6.6.1-W6.6.6., vol. 595.

Porowski, "Bulk and homoepitaxial GaN-growth and characterization," Journal of Crystal Growth, 1998, pp. 154-158, 189/190.

Porowski et al., "GaN crystals grown in the increased volume high pressure reactors," Mat. Res. Soc. Symp. Proc., 1997, pp. 35-40, vol. 449.

Melnik et al., "Properties of free-standing GaN bulk crystals grown by HVPE," Mat. Res. Symp. Proc., 1998, pp. 269-274, vol. 482.

Schineller et al., "Vertical-HVPE as a production method for free-standing GaN-substrates," 2007 International Conference on Compound Semiconductor Manufacturing Technology May 14-17, 2007, pp. 123-126, Austin, Texas.

Jain et al., "Growth of AlN films and their characterization," Physica Status Solidi (C), Applied Research, Jun. 2006, vol. 3, Issue 6, pp. 1491-1494.

"Vertical-HVPE as a Production Method for Free-Standing GaN-Substrates", by Schineller et al. ("the Schineller article") 4pgs (2007).

Office Action in U.S. Appl. No. 11/871,109 Mar. 17, 2010, 14pgs.

Amended dated Aug. 17, 2010, Response to Mar. 17, 2010 Office Action in U.S. Appl. No. 11/871,109, 16 pgs.

"Restriction Requirement in U.S. Appl. No. 11/871,109, Oct. 28, 2009, 6 pgs.", (Oct. 28, 2009).

Abernathy, C. R., et al., "Doping Sources for Growth of Group III-Nitrides", *Proceedings of the First Symposium on III-V Nitride Materials and Processes*, vol. 96-11, (1996), pp. 58-67.

Dwikusuma, F., et al., "Hydride vapor phase epitaxy growth of nitrides", *Vacuum Science and Technology: Nitrides as seen by the technology*, (2002), pp. 79-103.

Nasser, N. M., et al., "GaN Heteroepitaxial Growth Techniques", *Journal of Microwaves and Optoelectronics*, vol. 2, No. 3, (Jul. 2001), pp. 22-31.

Xia, Aibing, et al., "Synthesis, Structure, adn Properties of Magnesocene Amine Adducts. Structural Distortions Araising from N-H•••$C_5H_5$—Hydrogen Bonding and Molecular Orbital Calculations Thereof", *Organometallics*, vol. 22, No. 20, (2003), pp. 4060-4069.

HVPE APPARATUS AND METHODS FOR GROWTH OF P-TYPE SINGLE CRYSTAL GROUP III NITRIDE MATERIALS

CROSS REFERENCE TO RELATED APPLICATION

This application claims the benefit under 35 U.S.C. §119 to U.S. Provisional Application Ser. No. 60/829,093, filed on Oct. 11, 2006, the contents of which are incorporated herein by reference as though set forth in full.

FIELD OF THE INVENTION

The present inventions relate to hydride vapor phase epitaxy (HVPE) reactors and methods of growing p-type single crystal group III nitride materials including p-type single crystal gallium nitride.

BACKGROUND

Group III nitride compounds and their alloys, including GaN, AlN, InN, AlGaN and InGaN, have been developed for various optoelectronic and electronic applications. Gallium nitride (GaN) has received increased attention for use in optoelectronic and electronic semiconductor devices. GaN materials including AlGaN, InGaN and InAlGaN may have desired material characteristics and open the door to new devices and applications including solar cells, high-speed electronics, and short-wavelength and long-wavelength light emitters such as ultraviolet (UV), violet, blue, and green, yellow, red and infrared light emitting devices. While GaN materials and related devices may hold promise for new devices and applications, growth of bulk GaN crystals for use as substrates in such devices and applications has presented a number of challenges. One major limitation is the inability to fabricate single crystal bulk GaN, AlN, and InN materials at high growth rates with desired material qualities.

For example, it is known to grow low defect single crystal GaN materials using Metal Organic Chemical Vapor Deposition (MOCVD). With MOCVD, group III nitride compounds are grown from the vapor phase using metal organic compounds as sources of the Group III metals. Trimethylindium (TMI) is typically used as an indium source material, trimethylaluminum (TMA) is used as an aluminum source material and trimethylgallium (TMG) is used as a gallium source material. Ammonia gas is typically used as a nitrogen source.

These materials are supplied to a MOCVD reactor from source tanks that are located outside of the reactor. Within the MOCVD reactor, a metal organic material source reacts with ammonia resulting in the deposition of an epitaxial layer of a group III nitride material on a substrate. Electrically active impurities are introduced into the MOCVD reactor during material growth to control the electrical conductivity of the grown materials. More specifically, undoped group III nitride compounds normally exhibit n-type conductivity. Donor impurities, such as silicon or germanium, can be introduced into the grown material to control n-type conductivity and form materials with low electrical resistivity. Magnesium impurities in the form of metal organic compounds are introduced into the MOCVD reactor to form nitride materials having p-type conductivity. For example, Publication No. WO 00/68470 to Solomon et al. describes a MOCVD epitaxial growth system that includes a bubbler containing a magnesium-containing compound cyclopentadienylmagnesium (Cp2Mg). Hydrogen gas is used to carry the magnesium containing compound from the Cp2Mg source into the reaction zone to form materials having p-type conductivity.

While MOCVD has been used with some effectiveness in the past for growth of certain materials, MOCVD has limited applicability for growth of bulk group III nitride materials such as GaN, including p-type GaN. A very low growth rate is a major limitation of MOCVD. For example, with MOCVD, GaN can be grown at a rate that does not exceed several microns per hour. Consequently, deposition of GaN crystals having thicknesses on the order of millimeters is not feasible using MOCVD.

In addition to growth rate limitations, MOCVD systems have other shortcomings. For example, the configuration described by Solomon et al. is not suitable for HCl etching of magnesium delivery tubes in order to remove any magnesium-containing deposits from the tube walls. Magnesium deposits may result in inconsistent doping, which is not desirable, particularly for use in applications that require consistent doping characteristics including various high speed communication electronics, light emitting diode and laser diode devices.

Hydride vapor phase epitaxy (HVPE) has also been investigated as an alternative to MOCVD for fabricating group III nitride materials including p-type GaN and other materials. HVPE offers a number of advantages over MOCVD and other fabrication techniques including materials having low defect densities, improved growth rates, controllable doping, less complicated equipment and reduced fabrication costs. Further, HVPE growth can be performed at atmospheric pressure, thereby eliminating the need for vacuum equipment. HVPE is also suitable for mass production of semiconductor materials, structures and devices due to its low cost, excellent material characteristics, flexibility of growth conditions, and reproducibility. Examples of known HVPE reactors and methods for epitaxial and bulk growth of group III nitride materials, including p-type group III materials, are described in U.S. Pat. Nos. 6,447,604 to Flynn et al.; 6,596,079 to Vaudo et al., 6,613,143 to Melnik et al., 6,616,757 to Melnik et al., 6,656,285 to Melnik et al. and 6,936,357 to Melnik et al., "Vertical-HVPE as a Production Method for Free-Standing GaN-Substrates" by B. Schineller et al. (2007), and "Growth of AlN films and their characterization" by R. Jain et al., the contents of all of which are incorporated herein by reference.

It is known that defect densities of group III nitride layers grown on foreign substrates such as sapphire rapidly decrease as the thickness of the grown layer increases. For this purpose, HVPE can be used to grow thick layers or boules of such materials, e.g., having thicknesses of about 10 to 100 microns and thicker, to provide higher quality materials and devices with reduced defect densities. This may be accomplished by growth of materials at high growth rates and/or with long growth cycles. Long growth cycles may be an option with the consequence that more time is required. Further, challenges exist in efficiently fabricating thicker material or boules at fast growth rates (e.g., greater than 1 mm per hour) with desired material quality and low defect densities.

For example, Vaudo et al. describe growth of group III-V nitride boules at growth rates in excess of 50 microns (0.05 mm) per hour, with growth rates of 200 microns (0.2 mm) per hour being preferred, and growth rates in excess of 500 microns (0.5 mm) per hour being most preferred. To the inventor's knowledge, while Vaudo et al. may generally state that is preferred to have growth rates in excess of 500 microns per hour, such capabilities have not been implemented or are difficult to implement while achieving desired material qualities. For example, as noted by Schineller et al., as GaN layers grown by HVPE become thicker, a transition in the surface morphology is observed and presents challenges in growing GaN material with desired thicknesses and material qualities. For example, Schineller et al. explain that growth of GaN in a vertical HVPE reactor at rates only as high as 400 microns (0.4 mm) per hour were achieved. Further, as noted by Jain et al., HVPE as been successfully utilized to grow free-standing GaN substrates with growth rates only as high as 200 microns (0.2 mm) per hour, citing a Journal of Crystal Growth article by Vaudo et al. (2002).

More particularly, single crystal GaN material degradation at high deposition rates is due, in part, to resulting parasitic deposition of GaN on internal components of a HVPE reactor during growth of single crystal GaN on a seed upon which the single crystal material is grown. Parasitic deposition degrades reactor components, shifts growth parameters and may even lead to a crash of the HVPE reactor. More particularly, parasitic deposition on reactor components may stress the reactor components leading to cracking and damage of the components. Additionally, parasitic deposition may result in growth of inclusions in the GaN crystal itself. Thus, although a HVPE reactor may be configured for single crystal growth, the resulting material may have inclusions. Material degradation may also result from non-stable growth rates that occur during extended periods of growth and non-uniform supplies of source materials over growing surfaces.

Thus, known HVPE reactors and methods have been utilized to achieve GaN growth at rates up to 0.2 mm to 0.4 mm per hour. However, to the inventors' knowledge, known HVPE reactors and growth methods have not been successfully employed to grow high quality, uniform and low defect density GaN bulk single crystals at higher growth rates, e.g., greater than 1 millimeter per hour, due in part to parasitic deposition at these high growth rates. To increase the growth rate, it is necessary to increase amount of source materials in the growth zone which, in turn, increases the amount of source material in the growth apparatus, which leads to an increase in parasitic reactions and depositions.

A further limitation of known HVPE reactors and methods is growth of sufficiently thick p-type group III nitride materials having desired material qualities at high growth rates. Examples of known HVPE reactors and methods for fabricating p-type group III nitride materials including p-type GaN are described in U.S. Pat. No. 6,472,300 to Nikolaev et al., the contents of which are incorporated herein by reference, and WO 00/68470 to Solomon et al. While such system have been used with some effectiveness in the past, they may not provide stable p-type doping during long growth processes due to surface degradation and the changes in the size of the metallic acceptor sources (e.g., magnesium and/or zinc).

For example, a HVPE system described by Solomon et al. utilizes metallic magnesium a source of magnesium dopant. The metallic magnesium is housed within a dopant chamber that is positioned outside of a reactor or growth tube. The metallic magnesium is heated, and hydrogen carrier gas is used to deliver magnesium to the reactor and form p-type GaN. Solomon et al. also describe another HVPE system that involves passing HCl gas over a group III metal/Mg mixture to form a first reagent gas, which reacts with ammonia to form p-type GaN.

HVPE systems that utilize a metallic magnesium sources, however, are not suitable for bulk growth or long-duration growth cycles due to degradation of the metallic magnesium source which, in turn, results in inconsistent doping and doping characteristics that are not readily reproducible. Further, Solomon et al. describe using hydrogen as a carrier gas for the metallic magnesium. Hydrogen gas, however, is not desirable for this purpose due to the resulting high electrical resistivity of the grown gallium nitride material. Moreover, such systems are associated with accumulation of magnesium-containing compounds on the inner surfaces of gas delivery tubes of the reactor. Additionally, metallic magnesium have to be close to or above its melting point for purposes of high level doping of grown materials, but the resulting melted magnesium may react with boats or containers holding source materials, thereby contaminating internal components and source materials and resulting in inconsistent and unstable doping. Further, while it is known to use Cp2Mg in MOCVD reactors, such materials have not been utilized in HVPE reactors due to, for example, potential decomposition of Cp2Mg in HVPE reactor before magnesium-containing gases reach the growth zone, deposition of magnesium-containing compounds on internal reactor components and low and uncontrollable doping levels.

SUMMARY

According to one embodiment, a HVPE reactor configured for growth of a p-type group III nitride material includes a reactor tube, a growth zone located within the reactor tube and a non-metallic source of an acceptor impurity. The reactor tube, the growth zone and the non-metallic source are configured such that a reaction product resulting from a reaction of a gallium metal source and a reactive halide gas and a second reactive gas react in the presence of a gas containing the acceptor impurity to grow p-type group III nitride material in the growth zone.

According to another embodiment, a HVPE reactor configured for growth of a p-type group III nitride material includes a reactor tube including a growth zone, a growth zone located within the reactor tube, a source tube located within the reactor tube and including a gallium metal source, a number of gas sources and a Cp2Mg source located outside of the reactor. A first gas source is coupled to the source tube to supply to supply a reactive halide gas that reacts with gallium metal source to form a reaction product. A second gas source supplies a carrier gas that delivers the reaction product to the growth zone. A third gas source supplies another reactive gas to the growth zone. The growth zone, the source tube, the first gas source, the second gas source, the third gas source and the Cp2Mg source are configured such that the reaction product and the second reactive gas react in the growth zone in the presence of a gas containing magnesium from the Cp2Mg source to grow the p-type group III nitride material.

Another embodiment is directed to a method of growing a p-type group III nitride material by HVPE. The method includes delivering a reaction product and a reactive gas to a growth zone inside of a HVPE reactor tube. The method further includes delivering a gas having a magnesium compound from outside of the HVPE reactor tube and into the growth zone. P-type group III nitride material is grown in the growth zone by a reaction of the reaction product and the reactive gas in the presence of the gas having the magnesium compound.

A further embodiment is directed to a method of growing a p-type group III nitride material by HVPE. The method includes positioning a gallium metal source within a source tube inside of a reactor tube. A reactive halide gas is supplied to the source tube such that gallium metal and the reactive halide gas react to form a reaction product, which is then supplied to the growth zone by a carrier gas. A second reactive gas and a gas having a magnesium compound are also supplied to the growth zone. P-type group III nitride material is grown in the growth zone as a result of a reaction of the reaction product and the second reactive gas in the presence of the magnesium-containing gas derived from an external Cp2Mg source.

A further embodiment is directed to a method of growing a p-type single crystal group III nitride material by HVPE. The method includes positioning components including a seed and a seed holder in a reactor tube, the plurality of components including a seed holder or substrate and a seed supported by the seed holder. The method also includes covering at least a portion of one or more components with a flexible cover member. The method also includes delivering a reaction product resulting from a reaction of gallium metal source and a first reactive gas to the growth zone. The method also includes delivering a second reactive gas and a gas having a magnesium compound, which is from an external source, into the growth zone. P-type single crystal group III nitride material is then grown in the growth zone as a result of a reaction of the reaction product and the second reactive gas in the gas having the magnesium compound.

In one or more embodiments, a non-metallic source is a non-metallic magnesium source, such as Cp2Mg, which is solid at ambient temperature and evaporates. A magnesium-containing gas or a gas containing a magnesium compound may be derived from Cp2Mg and provided directly to the growth zone.

In one or more embodiments, group III nitride materials are grown by a reaction of a reaction product such as GaCl or AlCl3 and ammonia in the presence of a magnesium-containing gas derived from Cp2Mg.

In one or more embodiments, a tube for delivering a magnesium-containing gas includes sections having different diameters. For example, one section may have a diameter of about 20 millimeters, and another section may have a diameter of about 4 millimeters. With this configuration, flow of the magnesium-containing gas through the second section is faster than flow of the magnesium-containing gas through the first section, thereby reducing magnesium decomposition.

Further, in one or more embodiments, a tube for delivering magnesium-containing gas being coupled to first gas source or other suitable gas source such that an inner surface of the tube for delivering the magnesium-containing gas can be etched by the first reactive gas.

The p-type group III nitride material that can be grown with embodiments may be p-type GaN, p-type AlGaN or p-type InGaN, and such materials can be grown at fast growth rates greater than 1 millimeter per hour.

BRIEF DESCRIPTION OF THE DRAWINGS

Referring now to the drawings in which like reference numbers represent corresponding parts throughout and in which.

DETAILED DESCRIPTION OF ILLUSTRATED EMBODIMENTS

Embodiments relate to HVPE growth apparatus or reactors, fabrication methods and resulting high quality, low defect density single crystal group III nitride materials. Single crystal group III nitride materials are group III nitride materials having a continuous, unbroken crystal lattice and no grain boundaries, as opposed to amorphous materials, polycrystalline materials that are made up of a smaller crystals referred to as crystallites, which are which are small single crystal structures having random or chaotic orientations, and isotropic materials. Examples of single crystal materials that may be grown with embodiments include single crystal gallium nitride (GaN), which may have n-type, insulating, or p-type conductivity, and related pn structures. Embodiments can be implemented for growth of various other group III nitride materials including AlN, AlGaN, InN and InGaN and related structures. For ease of explanation, reference is made to single crystal gallium nitride and related structures and devices.

Figure 1:
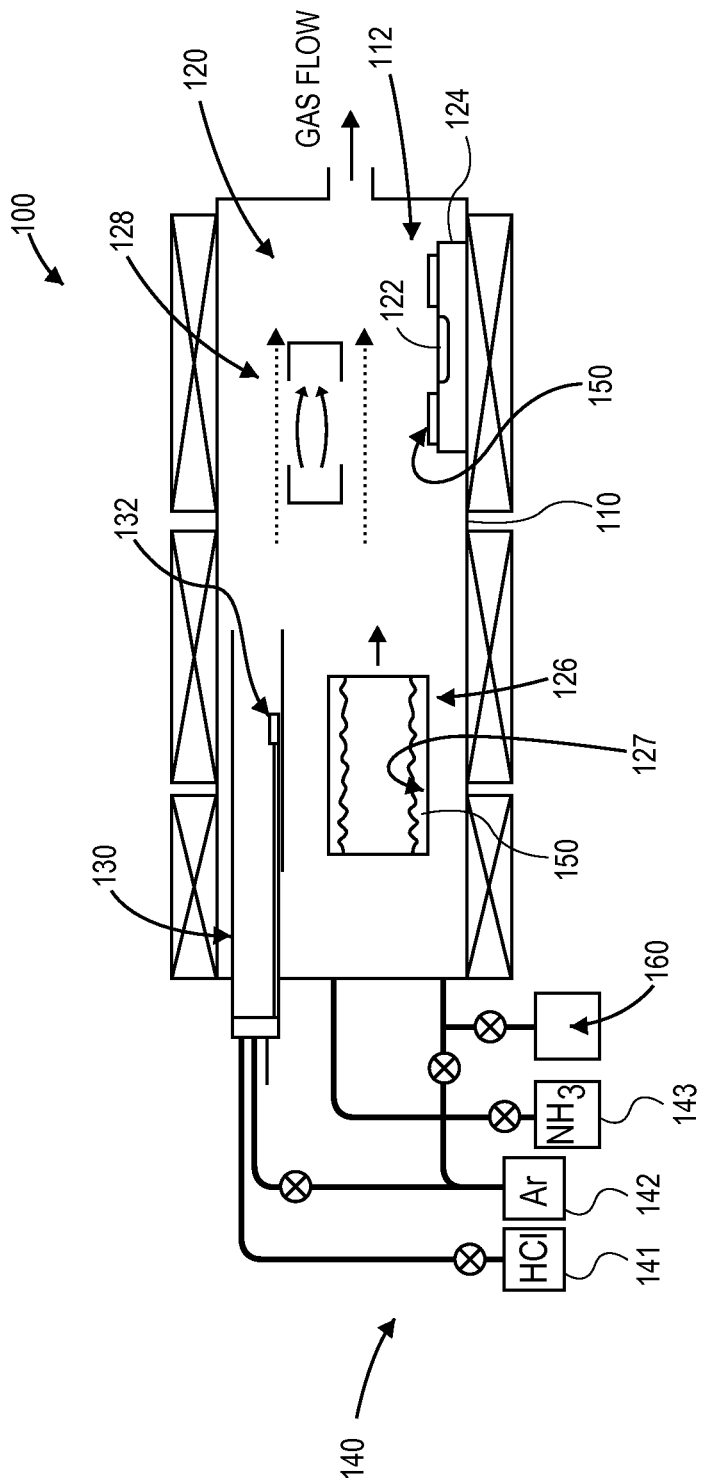
FIG. 1 is a schematic illustration of a horizontal HVPE reactor constructed according to one embodiment that may include one or more or all of an external non-metallic magnesium source, a flexible member that covers a surface an internal component, and a gas focusing element.

With embodiments, single crystal gallium nitride materials were grown for long durations and at high growth rates, e.g., growth rates exceeding 1 millimeter per hour, or about 17 microns per minute while maintaining desired material qualities. According to one embodiment, gallium nitride single crystals may be grown for a growth duration exceeding 30 minutes, e.g., exceeding 1 hour and even exceeding 10 hours. According to one embodiment, the growth rate exceeds 2 millimeter per hour and may be 5 millimeter per hour. Single crystal gallium nitride materials grown by embodiments at high growth rates have improved material parameters and uniformity and may be used in or enable various new device structures, capabilities and applications. Embodiments achieve these advantages by utilizing novel HVPE reactor components, configurations and methods that eliminate or reduce parasitic deposition of amorphous, polycrystalline and crystallite materials or structures on internal reactor components and inclusions in grown single crystal materials while the single crystal materials are grown with consistent and reproducible p-type doping characteristics using stable dopant sources. Referring to FIG. 1, a HVPE reactor 100 constructed according to embodiments includes a main or outer reactor tube 110 (generally referred to as "outer tube 110") and internal reactor components 120 including a seed or substrate 122 (generally referred to as "seed" 122) supported by a seed or substrate holder 124 (generally referred to as "seed holder" 124). For example, the seed 122 may be a relatively thin (e.g., 1-15 microns) gallium nitride layer having a low defect density less than $10^8$ cm$^{-2}$, preferably less than $10^7$ cm$^{-2}$ and more preferably less than $10^6$ cm$^{-2}$. The gallium nitride seed layer may be deposited directly on a sapphire substrate or on a buffer layer to form the seed 122 and may be grown in the same or in a separate HVPE process. For example, one suitable buffer layer is a AlN/AlGaN/GaN multi-layer buffer including layers having a thickness of about 1 to 50 nm.

The outer tube 110 may be made of quartz. Single crystal gallium nitride materials (not shown) are grown or deposited on the seed 122 in a growth zone 112 within the outer tube 110. The internal components 120 may also include other internal tubes or structures 126. For example, the tube 126 may be one of various internal reactor tubes 126 such as dopant delivery tubes, gallium source material delivery tube, aluminum source material delivery tube, etc., or may be a tube that may protect an inner surface of the main outer tube 110. The reactor 110 also includes one or source tubes 130 that contain a metal source 132 such as gallium metal, e.g., for growth of gallium nitride. Gas supplies 140 provide reactive and carrier gases utilized in HVPE reactors to transport reaction products and active gases to the growth zone 112.

According to one or more embodiments, an internal component 120 is partially or completely covered by a chemically stable, flexible or elastic material or member 150 (generally referred to as cover member 150) upon which a parasitic material, which may be substantially polycrystalline, is deposited during deposition of single crystal gallium nitride on the seed 122. For ease of explanation, reference is made to parasitic materials, which are defined as amorphous, polycrystalline materials that are made up of a smaller crystallites and isotropic materials, in contrast to single crystal materials as such terms are understood by persons of ordinary skill in the art. Controllable deposition of parasitic material in this manner prevents or reduces deposition of parasitic materials on surfaces of internal reactor components 120 and also prevents or reduces formation of inclusions within group III nitride materials that are grown on the seed 122. The flexible member 150 has the additional capability of protecting covered components from chemically active substances such as chemically active gases used during HVPE growth.

Embodiments also provide HVPE reactors and methods for growth of group III nitride material having desired and uniform p-type doping utilizing an external non-metallic magnesium source 160 as a p-type dopant source. During use, the source 160 evaporates, and the resulting gas is delivered directly to the growth zone 112 to react with other source and active gases 140 to grow p-type single crystal gallium nitride.

Embodiments further provide gas focusing elements or lenses located within the outer tube 110. A gas focusing element 128 is generally illustrated in FIG. 1. A gas focusing element 128 directs or restricts the direction in which certain gases flow inside of the outer tube 110 to reduce or prevent certain internal reactor components from being exposed to chemically active gases which, in turn, reduces parasitic deposition on internal reactor components 120. A gas focusing element 128 also increases the mass of source materials in the growth zone 112 and, in particular, on a growth surface to achieve higher single crystal material growth rates.

It will be understood that FIG. 1 generally illustrates certain components within the outer tube 110, e.g., an inner tube 126 and a gas focusing element 128, but in practice, the inner tube 126 and gas focusing element 128 are configured and positioned as needed depending on, for example, the number and location of source tubes 130, the number and position of active gas tubes and whether the reactor 100 is a vertical or horizontal reactor. Thus, FIG. 1 is provided to generally illustrate reactor 100 components. Further, it will be understood that structural configurations and methods of embodiments may be utilized individually and in combination as described in further detail with reference to other figures.

Embodiments involving one or more cover members 150 applied over one or more surfaces of one or more internal reactor components 120 are described in further detail with reference to FIGS. 2-8. Embodiments involving moving or replacing a cover member 150 during a growth cycle are described with reference to FIGS. 9-11. Embodiments involving an external non-metallic magnesium source 160 are described in further detail with reference to FIGS. 12-16. Embodiments involving gas focusing elements are described in further detail with reference to 17-20B. It will be appreciated that advantages of embodiments may be achieved with components of embodiments individually and in combination.

Figure 2:
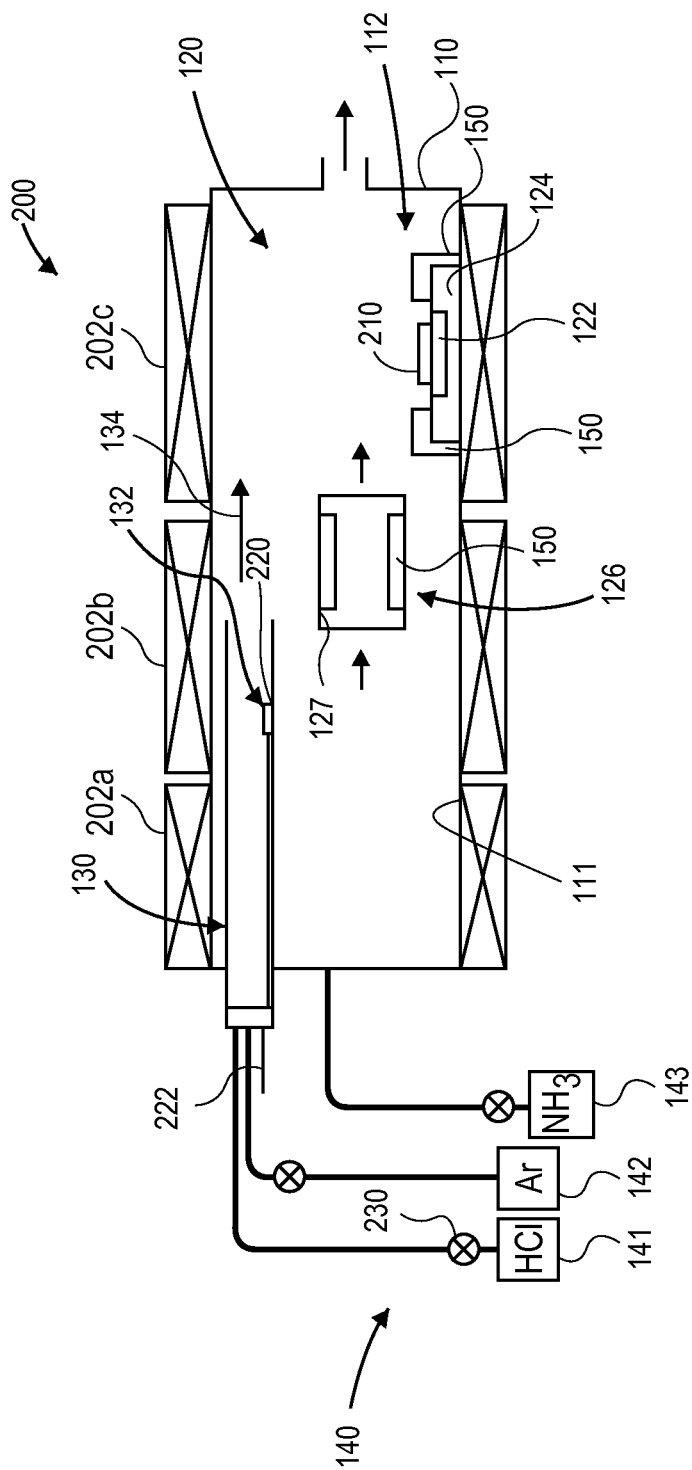
FIG. 2 is a schematic illustration of a horizontal a HVPE reactor constructed according to one embodiment having a flexible member that covers one or more surfaces of one or more internal components.

Referring to FIG. 2, a HVPE reactor 200 constructed according to one embodiment includes a horizontal furnace that defines different temperature zones using one or more heaters 202a-c (generally 202), each of which at least partially surrounds the outer tube 110. Various internal components 120 are positioned within the outer tube 110, e.g., one or more source tubes 130 (one source tube is illustrated), one or more inner tubes 126, and a seed 122 supported by a seed holder 124. Single crystal group III nitride material 210 is grown on the seed 122.

Figure 3:
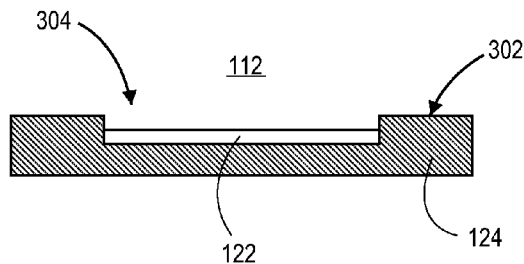
FIG. 3 is a schematic illustration of a seed or substrate supported by a seed holder.

With further reference to FIG. 3, in the illustrated embodiment, the seed holder 124 includes a top surface 302 that defines a cavity or pocket 304 in which the seed 122 is positioned. According to one embodiment, the seed holder 124 is made of quartz or sapphire. It should be understood that other seed holder 124 configurations may also be utilized.

Referring again to FIG. 2, a source boat or other suitable container 220 is located within each source tube 130 to hold the metallic gallium source material 132. A control rod 222 is used to position the boat 220 within the outer tube 110. A gas source 140 is coupled to each source tube 130, and the flow of gas through the source tubes 130 is controlled by one or more valves 230 or other suitable devices or flow control systems. The number of source tubes 130 and source materials 132 are determined by the desired composition of the single crystal layers 210 to be grown on the seed 122.

Embodiments may be utilized for growth of various single crystal group III nitride materials 210 including, for example, GaN, AlN, InN, AlGaN and InGaN. In the case of growth of gallium nitride, the source tube 130 includes a metallic gallium source material 132. In the case of growth of aluminum nitride, the source tube 130 includes a metallic aluminum material 132. For ease of explanation, this specification refers to growth of single crystal gallium nitride and a gallium source tube 130 and a metallic gallium source 132 held in a boat 220. The source tube 130 is coupled to a supply of a halide active gas 141, e.g., HCl gas and a supply of a carrier gas such as Argon (Ar) 143. A source of ammonia gas 142 is also coupled to reactor 110.

In the illustrated embodiment, internal components 120 of the reactor 200 include one or more source tubes 130, one or more other internal tubes 126, the seed holder 124 and the seed 122. According to one embodiment, the inner tube 126 is comprised of quartz and configured to carry active gases (e.g. ammonia 143) to the growth zone 112 through the inner tube 110. The tube may also protect an inner surface 111 of the outer tube 110 from active gases.

According to one embodiment, the flexible protective material 150 is in the form of a cover, lining, roll, or sheet (generally referred to as flexible cover 150) that is applied over one or more surfaces of one or more internal components 120 of the reactor 200. In one embodiment, the cover member 150 is flexible, deformable, bendable and/or elastic. For ease of reference, the cover member 150 is described as being flexible.

According to one embodiment, the cover member 150 is a flexible pure graphite material in the form of a sheet that is removably applied over one or more surfaces of an internal reactor component 120. The cover member 150 may be applied over the entire internal reactor component 120 or a portion thereof, and may be applied over or on one internal component 120 or multiple internal components 120. In the embodiment shown in FIG. 2, the cover member 150 is applied to cover an inner surface of the inner tube 126 and one or more surfaces, e.g., one or both of the top surface 302, of the seed holder 124. The cover member 150 does not degrade when heated to high temperatures, e.g., 1200° C.-1400° C., or when exposed to aggressive chemicals. As such, a cover member 150 may be repeatedly utilized.

Figure 4:
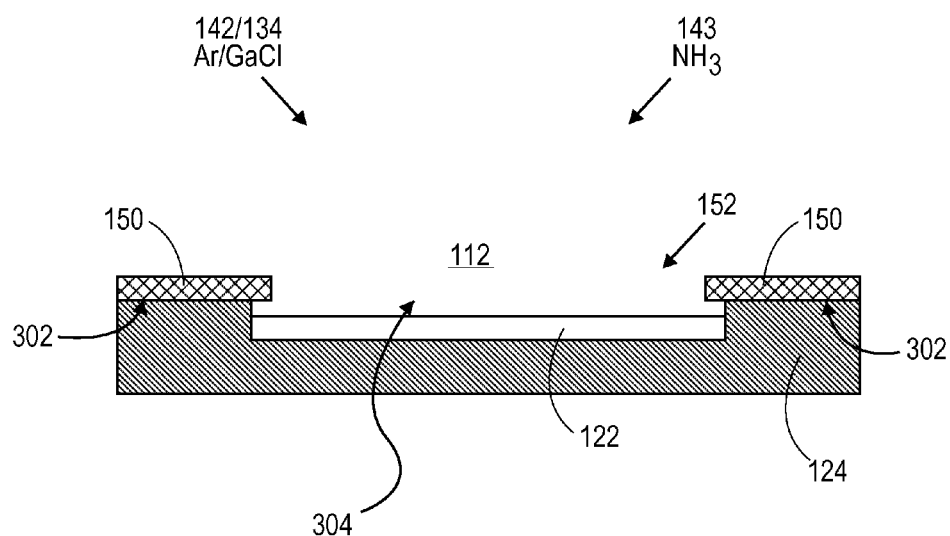
FIG. 4 is a schematic illustration of a flexible member covering a surface of a seed holder according to one embodiment.

With further reference to FIGS. 3 and 4, the seed holder 124 defines a cavity 304, and the flexible cover member 150 defines an aperture or window 152 so that the flexible member 150 can be applied over the top surface 302 of the seed holder 124. According to one embodiment, the shape and size of the window 152 generally corresponds to the shape and size of the cavity 304 defined by the seed holder 124. The thickness of the flexible member 150 may be on the orders or microns or millimeters and may vary depending on, for example, the type of material and desired strength and flexibility. Further, the flexible member 150 can be bent in various configurations, and the shape, size and number of windows 152 may vary. For example, the window 152 may define an area of about a square millimeter to several square centimeters, e.g., about 1 to about 1000 square centimeters, or larger.

Figure 5:
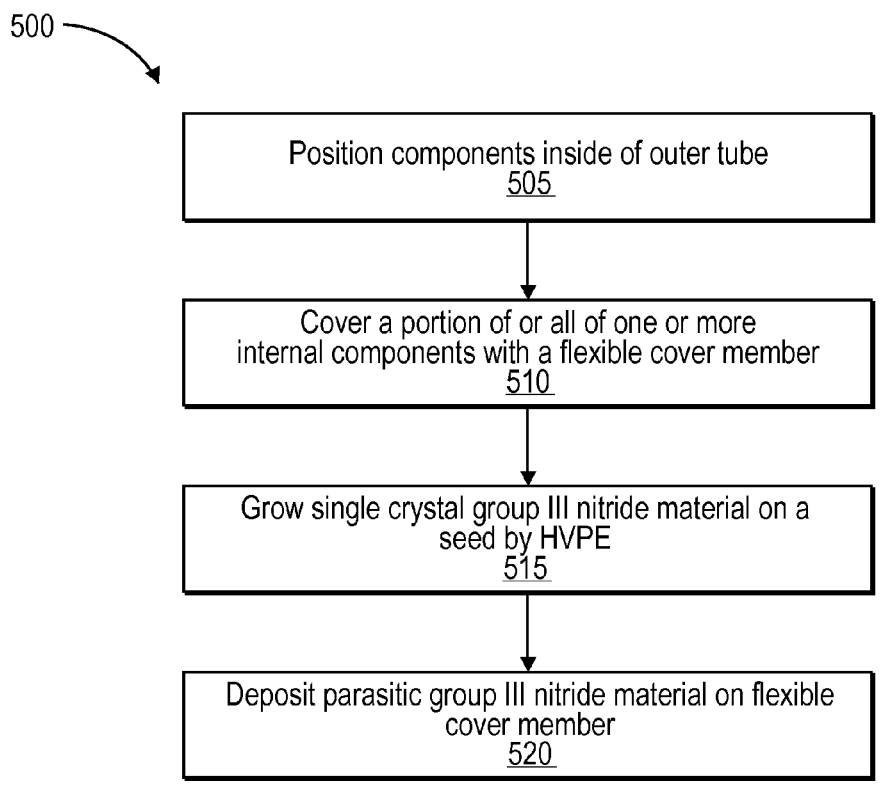
FIG. 5 is a flow chart of a method of growing single crystal group III nitride materials with the reactor constructed as shown in FIGS. 2-4.

Referring to FIG. 5, during use, the internal components 120 such as the seed holder 124, the seed 122, the inner tube 126 and one or more source tubes 130 are positioned inside of the outer tube 110 at stage 505. At stage 510, surfaces of internal components 120, e.g., surfaces that would be exposed to active gases such as HCl gas 141, ammonia gas 143, a gas containing gallium chloride 134 (e.g., for growth of gallium nitride) and/or a gas containing aluminum chloride (e.g., for growth of aluminum nitride, and other active gases associated with growth of a particular group III nitride material, may be partially or completely covered by one or more flexible members 150. For example referring again to FIG. 4, the flexible member 150 may be applied over the top surface 302 of the seed holder 124. Further, the flexible member 150 may be applied to line an inner surface of the inner tube 126.

Figure 6:
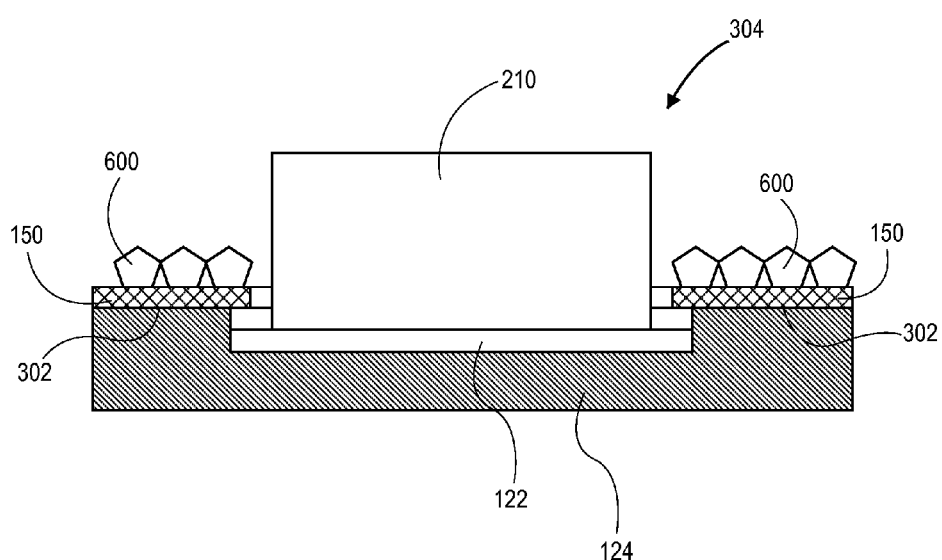
FIG. 6 is a schematic illustration showing growth of single crystal gallium nitride material on the seed or substrate and parasitic deposition of gallium nitride material on the flexible cover member according to one embodiment.
Figure 7:
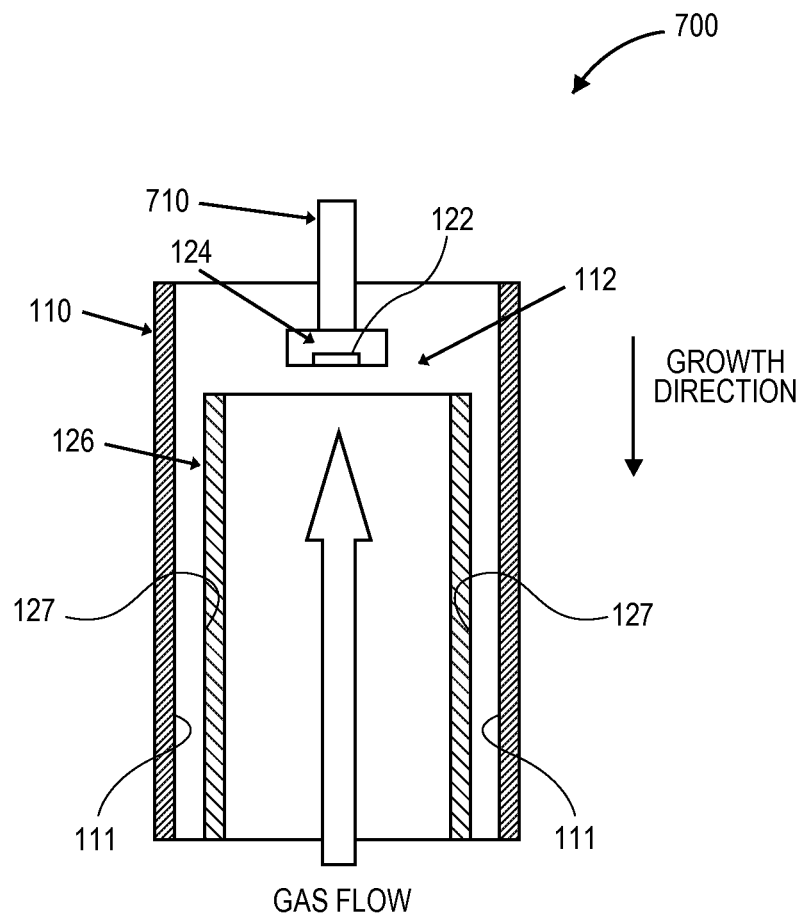
FIG. 7 is a schematic illustration of an inner element or tube positioned within a main reactor tube of a vertical HVPE reactor.
Figure 8:
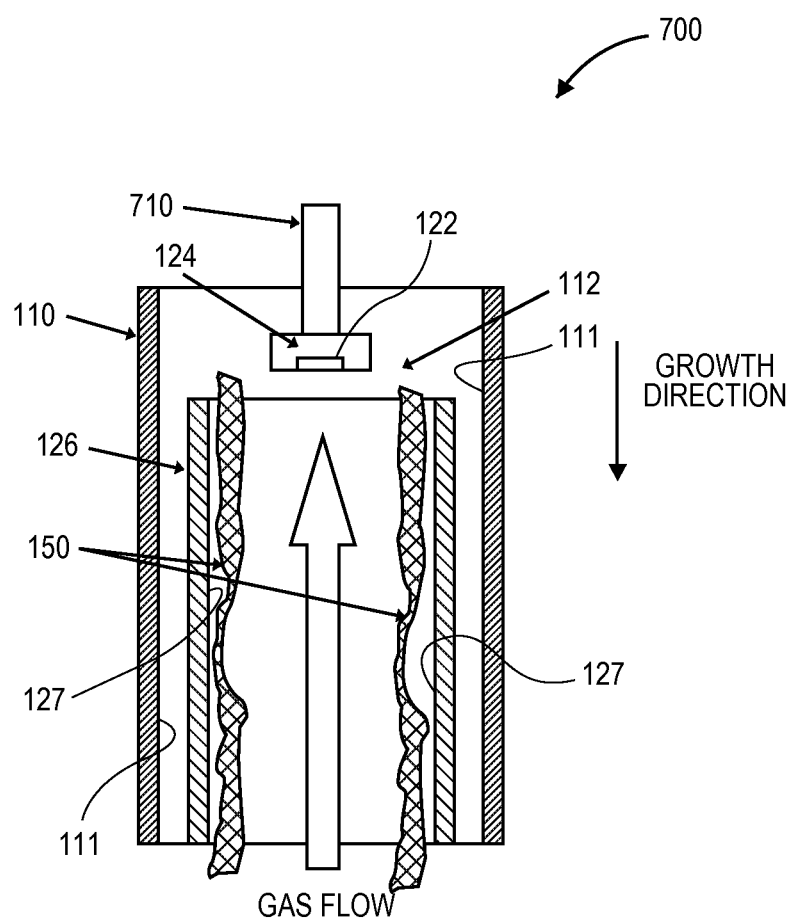
FIG. 8 is a schematic illustration of a flexible member covering an inner surface of the inner tube shown in FIG. 7 according to one embodiment

Referring again to FIG. 5 and with further reference to FIG. 6, at stage 515, a single crystal group III nitride material 210 is grown on the seed 122 as a result of the reaction of gallium chloride 134 carried by Argon gas 142 and ammonia 143 while, at the same time, parasitic gallium nitride 600, which may be polycrystalline, amorphous or isotropic, is deposited on the flexible sheet(s) 150 at stage 520.

More particularly, for growth of the single crystal gallium nitride 210 (stage 515) and deposition of the parasitic gallium nitride 600 (stage 520), the reactor 200 is filled with Argon gas 142, the flow of which is controlled by a valve 230. The seed holder 224 and the seed 222 supported thereby are heated to the desired growth temperature, e.g., about 800-1200° C., more preferably to a temperature of between 1000-1100° C. Gallium source material 132 is heated to a suitable temperature (e.g., about 750-1050° C.), and gaseous HCl from a tank or source of HCl gas 141 (generally referred to as HCl gas 141 or a source of HCL gas 141) is introduced into the source tube 130. HCl gas 141 reacts with the gallium metal source 132 to form a reaction product 134 in the form of gallium chloride, which is delivered to the growth zone 112 by Argon gas from a source or tank of Argon gas 142 (generally referred to as Argon gas 142 or a source of Argon gas 142) 142 flowing through the source tube 130. Simultaneously, ammonia gas from a source or tank of ammonia gas 143 (generally referred to as ammonia gas 143 or a source of ammonia gas 143) is delivered to the growth zone 112. The gallium chloride 134 carried through the source tube 130 by Argon gas 142 and the ammonia 132 react, resulting in growth of gallium nitride 210 (e.g., n-type GaN 210) on the seed 122. Further details of HVPE growth processes and parameters are described in U.S. Pat. No. 6,555,452 to Nikolaev et al., the contents of which were previously incorporated herein by reference.

Referring again to FIG. 6, with embodiments, parasitic gallium nitride 600 is deposited on the flexible member 150 while desired single crystal gallium nitride 210 is grown on the seed 122. In the illustrated embodiment, parasitic gallium nitride 600 grows only on the flexible member 150, and the single crystal gallium nitride 210 grows through the window 152 defined by the flexible member 150. In this manner, embodiments advantageously manipulate parasitic deposition of gallium nitride 600 such that parasitic materials 600 are controllably deposited on the flexible member 150 rather than on other internal reactor components 120 or within the single crystal gallium nitride 210 itself as it is grown. Thus, embodiments are capable of protecting internal reactor components 120 from parasitic deposition 600, thereby reducing stresses and damage to such components and providing for more consistent growth parameters, while also reducing or eliminating formation of inclusions within the single crystal gallium nitride 210. Embodiments also reduce or prevent contact between the single crystal gallium nitride 210 and parasitic materials 600, which may result in stress or cracking of single crystal gallium nitride 210 during growth.

Embodiments achieve these advantages and unexpected results by manipulating the material properties of the flexible member 150. The flexibility or elasticity of the flexible member 150 allows the flexible member 150 to bend or deform, but not break, under the weight of the parasitic material 600. Consequently, forces and weight resulting from deposition of parasitic material 600 are not directly translated to the seed holder 124 and do not cause stresses and fractures in the seed holder 124.

For this purpose, according to one embodiment, the flexible sheet 150 is made of graphite and may be in the form of felt or paper. Parasitic materials 600 are deposited on the graphite member 150, which does not contaminate the single crystal gallium nitride 210 grown on the seed 222 and through the window 152 defined by the flexible member 150. If necessary, the flexible member 150 may be annealed before or during growth in order to remove impurities. For example, annealing may be performed in Argon gas 142 at a temperature of about 1100° C.

FIG. 2 illustrates a flexible member 150 that is part of a horizontal reactor 200. However, flexible member 150 components may also be integrated within vertical reactors 700. For example, referring to FIGS. 7 and 8, a vertical reactor 700 constructed according to one embodiment includes an inner tube 126 that is positioned within a main or outer vertical reactor tube 110. The inner tube 126 includes an inner lining of flexible material 150. The seed holder 124 is attached to a rod or shaft 710 that is controllably movable to position the seed holder 124 and the seed 122 supported thereby into and out of the growth zone 112. In this manner, chemically active gases, e.g., HCl gas 141, ammonia gas 142 and a gas containing gallium chloride 134, flow through the inner tube 126 tube. The tube 126 may also carry a single chemically active gas. Parasitic material 600 is deposited on the flexible member 150 lining applied to the tube 126 rather than on the inner surface 127 of the inner tube 126 itself or on the inner surface 111 of the outer reactor tube 110, while directing active gases to the growth zone 112. The inner surfaces 127 of the inner tube 126 and the inner surfaces 111 of the outer tube 110, both of which may be made of quartz, are not exposed to active gases or are exposed to smaller quantities of such gases. The flexible member 150, therefore, advantageously protects the internal tube 126 and the outer tube 100 from parasitic deposition 600 and chemical etching, thereby reducing stress, cracking and damage to these components that may otherwise occur if due to active gas exposure.

Figure 9:
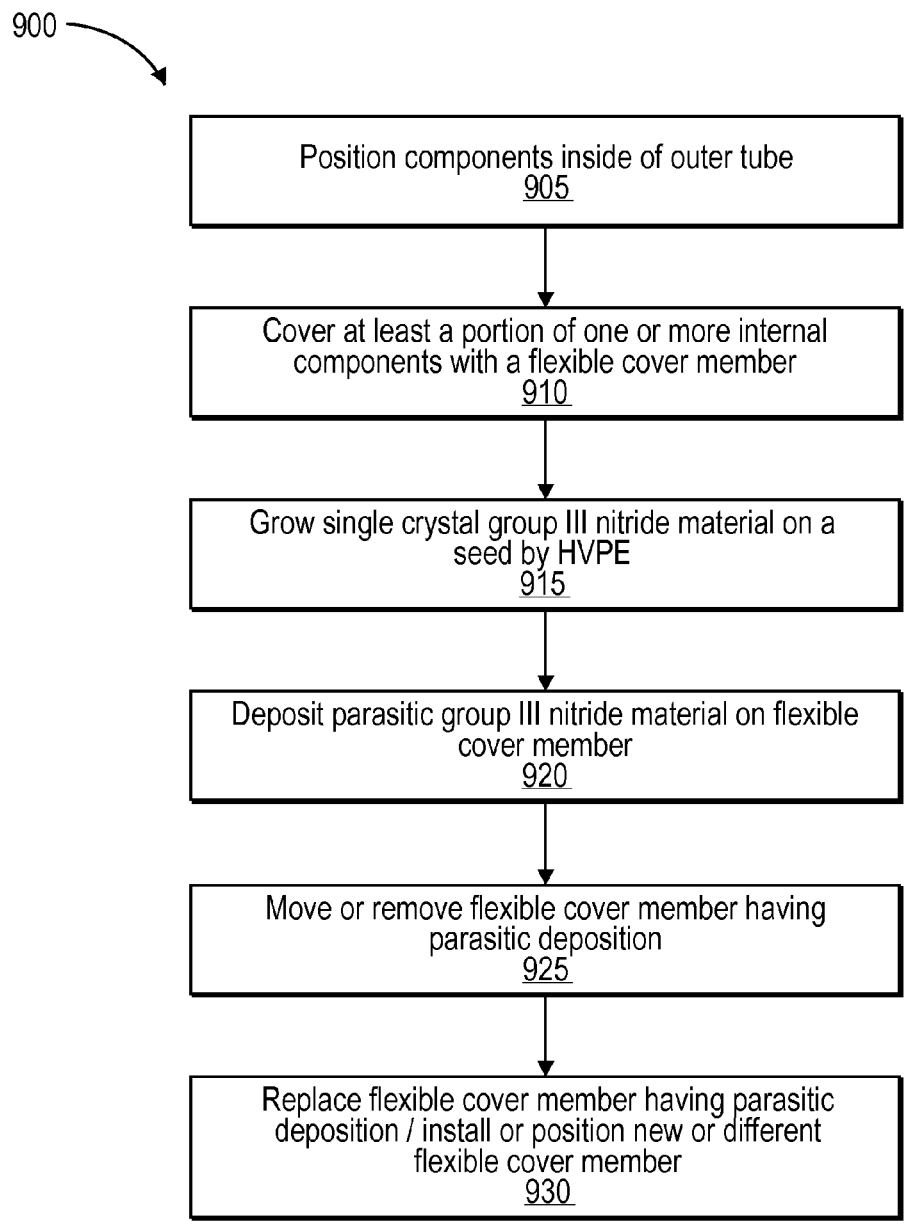
FIG. 9 is a flow chart of a method of growing single crystal group III nitride materials and moving or replacing a flexible member on which parasitic material has been deposited according to one embodiment.

Referring to FIG. 9, one embodiment is directed to a method 900 of moving or replacing the flexible member 150 or sections thereof having parasitic deposits 600 thereon. In the illustrated embodiment, stages 905-920 are similar to stages 505-520 sown in FIG. 5. At stage 905, internal components 120 such as the seed holder 124, the seed 122, the inner tube 126 and one or more source tubes 130 are positioned inside of the reactor tube 110. At stage 910, one or more internal components 126 are covered with a cover member 150. At stage 915, single crystal gallium nitride 210 is grown on the seed 122 as a result of the reaction of gallium chloride 134 carried by Argon gas 142 and ammonia 143 while at stage 920, parasitic gallium nitride 600 is deposited on the flexible member 150. At stage 925, the flexible member 150 having parasitic deposits 600 may be removed, e.g., slidably removed, from the top surface 302 of the seed holder 124 or slidably removed from the inner surface 127 of the inner tube 126.

Whether the flexible member 150 is slidably removed from the seed holder 124 may depend on, for example, the depth of the cavity 304 defined by the seed substrate 120, the height of the single crystal material 210 and the height of the single crystal material 210 relative to the flexible member 150. For example, if the single crystal material 210 thickness is such that it extends above the flexible member 150, then the flexible member 150 can be lifted off from the top surface 302 of the seed holder 224. Otherwise, the flexible member 150 may be slidably removable from the seed holder 224.

Further, with embodiments that utilize a flexible graphite member 150, the single crystal gallium nitride 210 will not be contaminated if the single crystal gallium nitride 210 contacts the graphite flexible member 150 during growth or during movement or removal of the flexible member 150. Additionally, the flexibility of the cover member 150 eliminates or reduces stresses on and cracking of the growing single crystal gallium nitride 210 in the event that the cover member 150 and the growing crystal 210 come into contact with each other during growth.

At stage 930, a new portion of the flexible member 150 (e.g., a new portion having no parasitic deposits 600 or a previously used portion having less parasitic deposits 600) is positioned on the seed holder 224 or over the inner surface 111 of the inner tube 126 to replace the previously used flexible member 150 or portion thereof. In this manner, embodiments advantageously allow extended growth processes to be performed while replacing used flexible members 150 or components thereof to maintain controlled deposition of parasitic materials 600 on the flexible member 150 rather than on internal components 120 of the reactor. For this purpose, for example, the flexible member 150 may be stored on rolls such that new portions of the flexible member 150 may be unrolled from a first roll, and portions of the flexible member 150 having parasitic deposits 600 may be rolled up onto a take-up roll or other suitable storage device.

Figure 10:
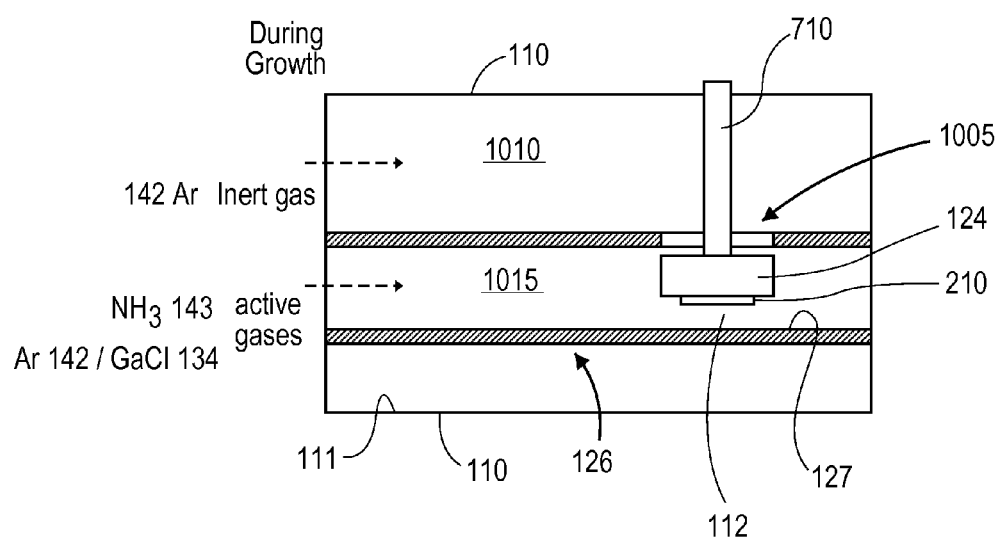
FIG. 10 is a schematic illustration of a HVPE reactor having an inner tube and a seed positioned within the inner tube and in the path of active gases during growth of single crystal group III nitride material on the seed.
Figure 11:
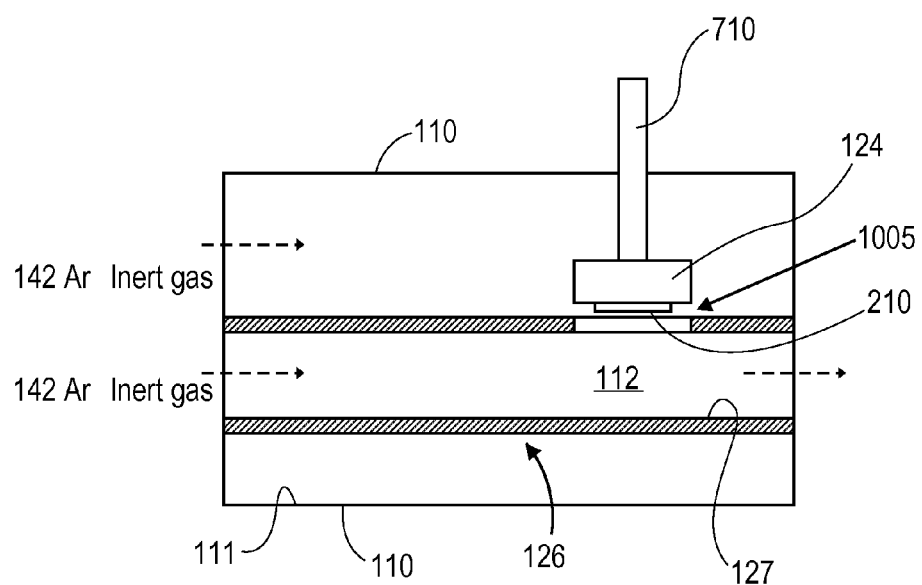
FIG. 11 is a schematic illustration of the HVPE reactor shown in FIG. 10 and the seed and crystal material grown thereon being movable through an aperture defined by the inner tube to allow the inner tube to be replaced during a growth run according to one embodiment.

Referring to FIGS. 10 and 11, according to another embodiment, the inner tube 126 may be replaced during growth of single crystal gallium nitride 210. In the illustrated embodiment, the inner tube 126 defines an aperture 1005. The seed holder 124 is coupled to rod or shaft 710 that is controllably movable to move the seed 122 and single crystal gallium nitride 210 grown thereon into and out of the inner tube 126 and through the aperture 1005 and, therefore, into and out of a first gas environment 1010 and a second gas environment 1015 within the inner tube 126 that includes the growth zone 112.

As shown in FIG. 10, during growth, the seed 122 and the seed holder 124 are positioned inside of the second gas environment 1015 in the growth zone 112. The first gas environment 1010 includes flowing active gases, e.g., a gas including gallium chloride 134 and ammonia 143 so that single crystal gallium nitride 210 is grown on the seed 222. The top surface 302 of the seed holder 224 may be covered by the flexible cover member 150 (as described above) so that single crystal gallium nitride 210 is grown on the seed 222 while parasitic material 600 is deposited on the flexible member 150. The inner tube 126 or other suitable internal component may also be fabricated from flexible and elastic graphite similar to the flexible member 150. Alternatively, the inner tube or other suitable component may be composed of quartz, graphite, sapphire and other suitable materials.

During growth, it may be necessary to replace the inner tube 126 due to deposition of parasitic material 600 on the flexible member 150. For this purpose, active gas flows through the second gas environment 1015 can be stopped, an inert gas such as Argon gas 142 can flow through the second environment 1015, and the seed holder 124 and seed 122 upon which single crystal gallium nitride 210 has grown can be moved from the second environment 1015 to a non-growth position in the first environment 1010 that includes inert gas. The inner tube 126 may then be moved, replaced or exchanged with another inner tube 126 or suitable internal component. The seed holder 124, seed 122 and the single crystal material 210 grown thus far may then be re-inserted through the aperture 1005 into the growth zone 112. Flow of active gases may be resumed to continue growth of the single crystal gallium nitride 210 on the seed 122 in the growth zone 112, while parasitic material 600 is deposited on the new flexible member 150. In this manner, embodiments advantageously move or exchange internal reactor components 120 during a growth cycle in order to prevent cracking and/or breakage of internal components 120 due to heavy parasitic deposition 600. These capabilities are particularly advantageous during long growth runs during which larger quantities of parasitic material 600 are deposited on the flexible member 150. The reduction or elimination of negative aspects of parasitic deposition 600 allows growth of large single crystal gallium nitride layers or structures at higher growth rates.

Figure 12:
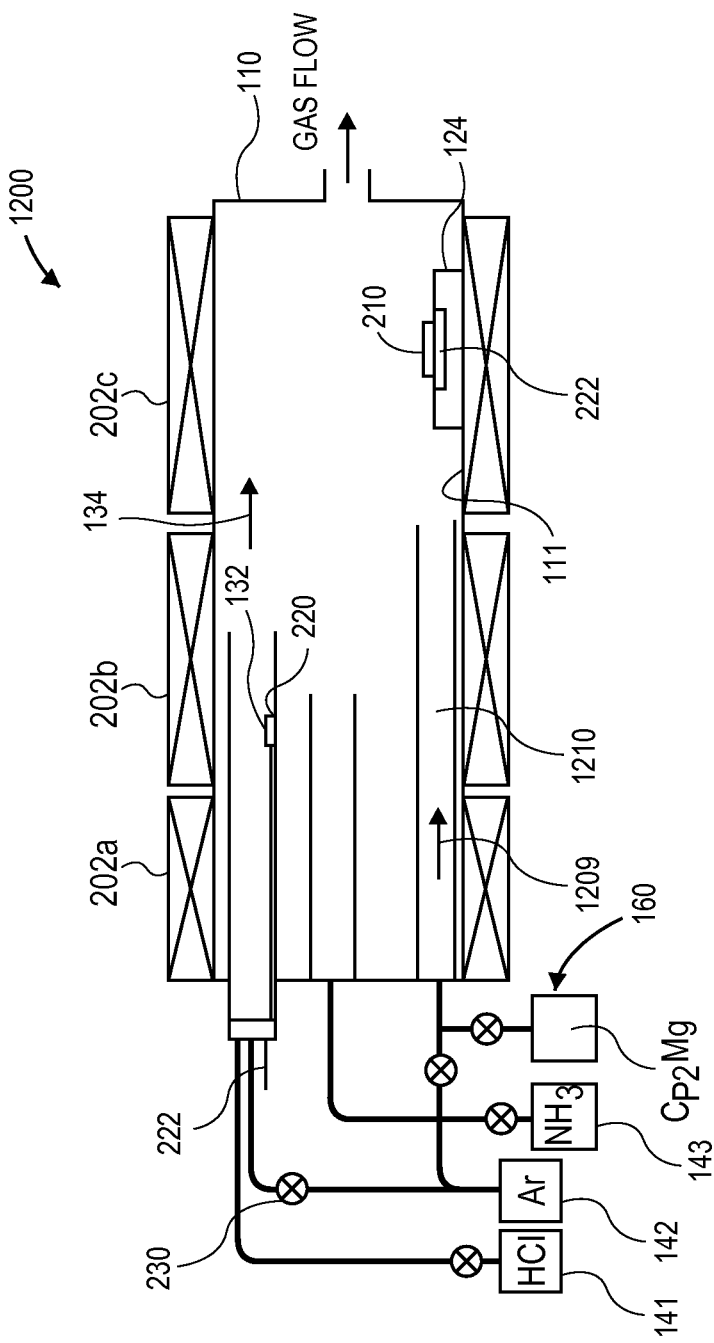
FIG. 12 is a schematic illustration of a HVPE reactor constructed according to another embodiment including an external non-metallic magnesium source and a magnesium-containing gas that is delivered to a growth zone by a carrier gas other than hydrogen.
Figure 13:
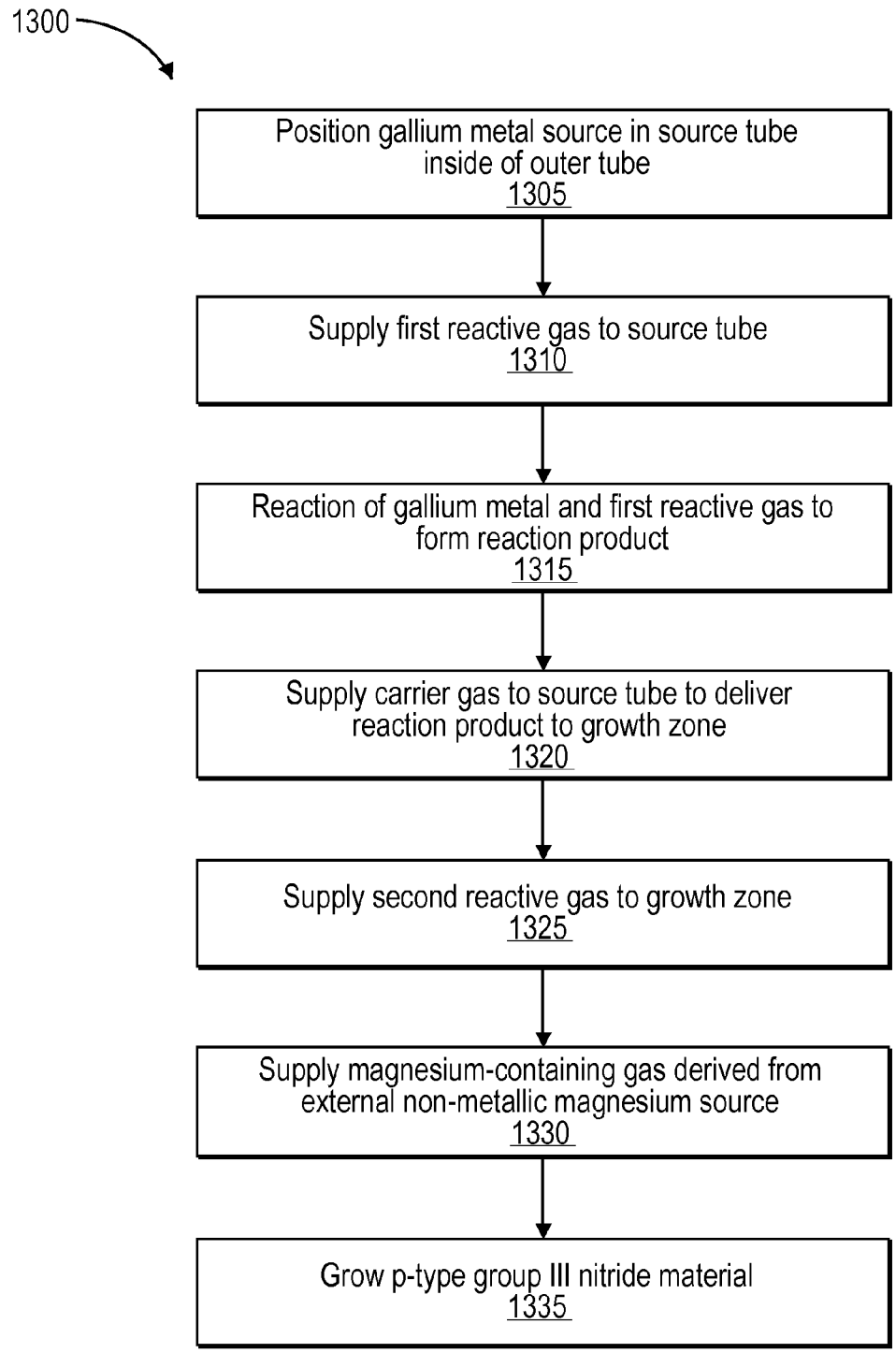
FIG. 13 is a flow chart of a method of growing single crystal p-type group III nitride materials with the HVPE reactor constructed as shown in FIG. 12.

Referring to FIGS. 12 and 13, other embodiments are directed to a HVPE reactor 1200 having an external non-metallic material or source 160, which serves as a dopant source for growth of p-type single crystal gallium nitride 210 and other p-type single crystal group III nitride materials, and a method 1300 for growing p-type gallium nitride 210 and other p-type group III nitride materials for long duration and at fast growth rates. For ease of explanation, reference is made to p-type single crystal gallium nitride 210.

According to one embodiment, the external non-metallic material or source is an external non-metallic magnesium source 160 rather than metallic magnesium. According to one embodiment, the non-metallic magnesium source 160 is cyclopentadienylmagnesium (Cp2Mg) 1207.

Embodiments utilize novel HVPE reactor configurations that can be adapted for use with Cp2Mg 1207 as a non-metallic source of magnesium for growth of p-type gallium nitride 210. Embodiments address technical issues of known HVPE reactors by eliminating or reducing decomposition of Cp2Mg in HVPE reactor prior to gases reach the growth zone 112, eliminating or reducing deposition of magnesium-containing compounds on internal reactor components 120 and providing for high and controllable an stable doping levels, which are consistent across the grown material 120. These advantages are achieved while p-type gallium nitride is grown at fast growth rates, e.g., about 10 microns per minute and higher.

More specifically, a method 1300 of growing p-type gallium nitride 210 includes positioning the gallium metal source 132 inside of the reactor tube 110 at stage 1305. A first reactive gas, such as HCl gas 141, is supplied to the source tube 130 at stage 1310, thereby forming a reaction product, such as gallium chloride 134, at stage 1315. At stage 1320, a carrier gas 142, such as Argon 142, is supplied to the source tube 130 to deliver the gallium chloride 134 to the growth zone 112. At stage 1325, a second reactive gas, such as ammonia 143, is simultaneously supplied to the growth zone 112.

At stage 1330, gaseous Cp2Mg 1209 is formed from the external Cp2Mg source 160. The source 160 is solid Cp2Mg 1207 that may be maintained at ambient temperature and evaporates at ambient and elevated temperatures to form the magnesium-containing gas 1209. At stage 1335, a carrier gas 142 other than hydrogen flows through a dopant delivery tube 1210 to deliver the magnesium-containing gas 1209 to the growth zone 112. For this purpose, Argon gas 142 can flow at low rates, e.g., about 1 sccm, to about 1000 sccm through a vessel that holds the solid Cp2Mg 1207, and the magnesium-containing gas 1209 may flow through the delivery tube 1210 at a gas flow velocity of at least about 1 meter per second. Flow of Argon gas 142 through a vessel holding the solid Cp2Mg 1207 may be controlled independently of the Argon gas 142 flowing through the delivery tube 1210. Additional Argon flow 1420 (generally referred to as Argon push flow) is used to controllably increase flow velocity of magnesium-containing gas 1209 inside of the HVPE reactor. The Argon push flow 1420 may be varied from about 0.1 to 5 slm.

The reaction of gallium chloride 134 and ammonia 143 in the presence of magnesium-containing gas 1209 in the growth zone 112 results in growth of low defect density p-type single crystal gallium nitride 210 on the seed 122. With embodiments, low defect density, single crystal, uniformly doped, p-type GaN 210 may be grown at high growth rates, e.g., from about 1 micron per minute to more than 1 millimeter per hour, and even greater than 2 millimeters per hour. Growth durations greater than 10 hours were demonstrated while maintaining single crystal quality and stable p-type doping, as demonstrated by dopant variations of less than 5%. For bulk p-GaN 219 growth, process durations exceeding 100 hr may also be utilized. It should understood that various steps shown in FIG. 13 may occur simultaneously, and reference is made to separate stages for ease of explanation.

HVPE reactor 1200 and method 1300 embodiments provide a number of advantages over known MOCVD and HVPE reactors. For example, in known MOCVD systems, hydrogen is used as a carrier gas to deliver Cp2Mg into the MOCVD reactor. Use of hydrogen gas, however, results inpassivated magnesium atoms within grown gallium nitride materials, which reduces the electrically active magnesium concentration and increases the electrical resistivity of the grown material. These results are not desirable.

With embodiments, on the other hand, Argon gas 143, rather than Hydrogen gas, is used to deliver the magnesium-containing gas 1209 to the growth zone 112 to reduce passivated magnesium atoms within the grown material 210 and thereby prevent increased resistivities resulting from use of hydrogen gas. Further, with embodiments, magnesium delivery or source tubes 1210 can be etched with a mixture of HCL and Argon gases 141, 142 in order to remove any magnesium-containing deposits from the inner surfaces of the tubes 141, 142. These capabilities advantageously improve the consistency and reproducibility of p-type doping of single crystal gallium nitride 210. For example, HCl etching may be performed by flowing about 10 to 1000 sccm of HCl gas 141 through the magnesium delivery tube 1210 before and after a doping process.

Further, with embodiments, HVPE reactors can be configured such that a magnesium-containing gas 1209 can be carried through a hot zone of the HOVE reactor. In one embodiment, the magnesium-containing gas 1209 flows through the delivery tube 1210 and through several high temperature zones, including a source zone, which may be at a temperature of about 800-900° C., and through a gas mixing zone, which may be at a temperature of about 900°-1000° C. The magnesium-containing gas 1209 in the growth zone 112 is then used to grow low defect density p-type single crystal gallium nitride 210 at fast growth rates. This is in contrast to known MOCVD systems, which involve injection of relatively cold gases directly into the growth zone.

Figure 14:
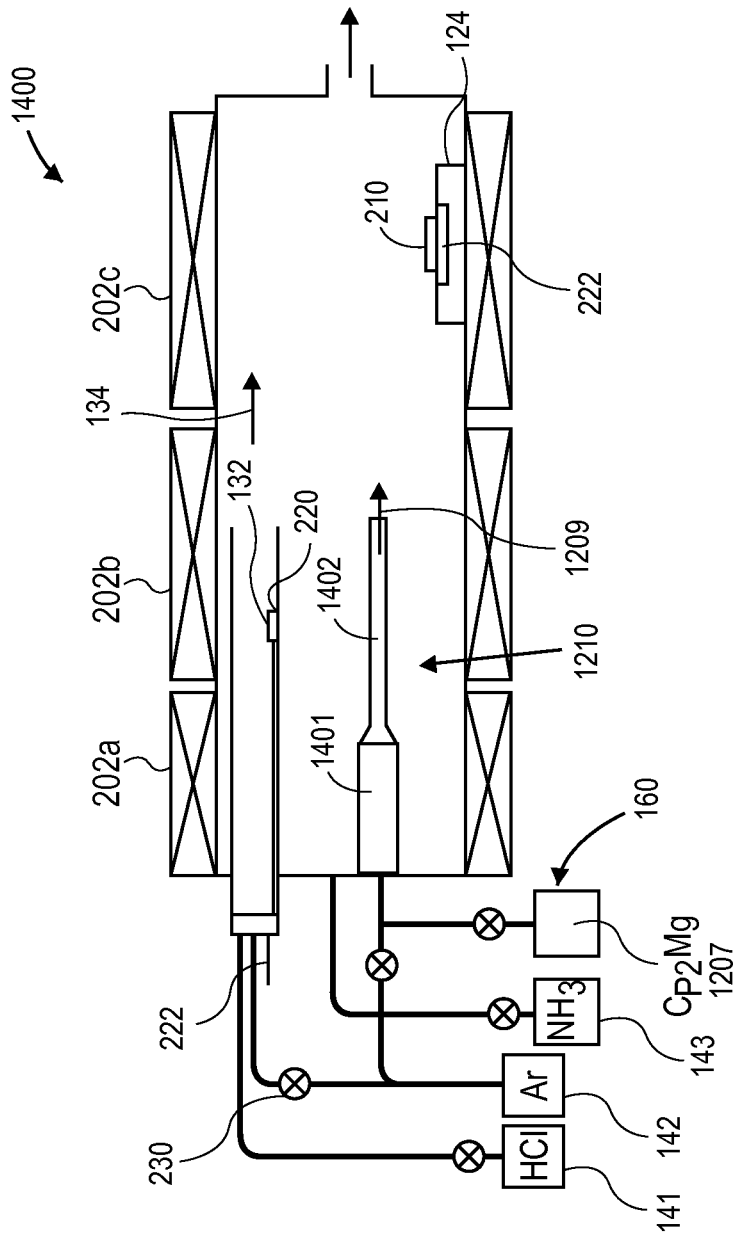
FIG. 14 is a schematic illustration of a HVPE reactor constructed according to another embodiment including an external non-metallic magnesium source that is delivered through a tube having sections of different diameters.

Referring to FIG. 14, according to an alternative embodiment, a HVPE reactor 1400 includes a source tube 1210 that delivers the magnesium-containing gas 1209 that is tapered or has one or more sections with a reduced diameter. In the illustrated embodiment, the deliver tube 1210 includes a first section 1401 associated with an end of the outer tube 110 and having a first diameter. A second section 1402 extends from the first section 1401 and has a second, smaller diameter. According to one embodiment, the first diameter of the first section 1410 is about 20 millimeters, and the second diameter of the second section 1402 is about 4 millimeters.

With this configuration, embodiments allow magnesium-containing gas 1209 to flow through the delivery tube 1210 and, in particular, through the reduced diameter section 1402 of the delivery tube 1210, at a sufficiently high rate to reduce or prevent decomposition of the magnesium compound within the tube 1210 while the magnesium-containing gas 1209 is delivered through a hot portion of the reactor 1400. With this configuration, embodiments advantageously increase the speed at which magnesium-containing gas 1209 flows through the delivery tube 1210, thereby reducing the amount of time that the magnesium-containing gas 1209 is exposed to high temperatures in source and gas mixing zones which, in turn, reduces magnesium decomposition that would otherwise occur at these high temperatures. According to one embodiment, the flow rate of magnesium-containing gas 1209 through the first section 1401 is about 0.06 m/sec, and the flow rate of magnesium-containing gas 1209 through the second section 1402 is about 1.5 m/sec.

Figure 15:
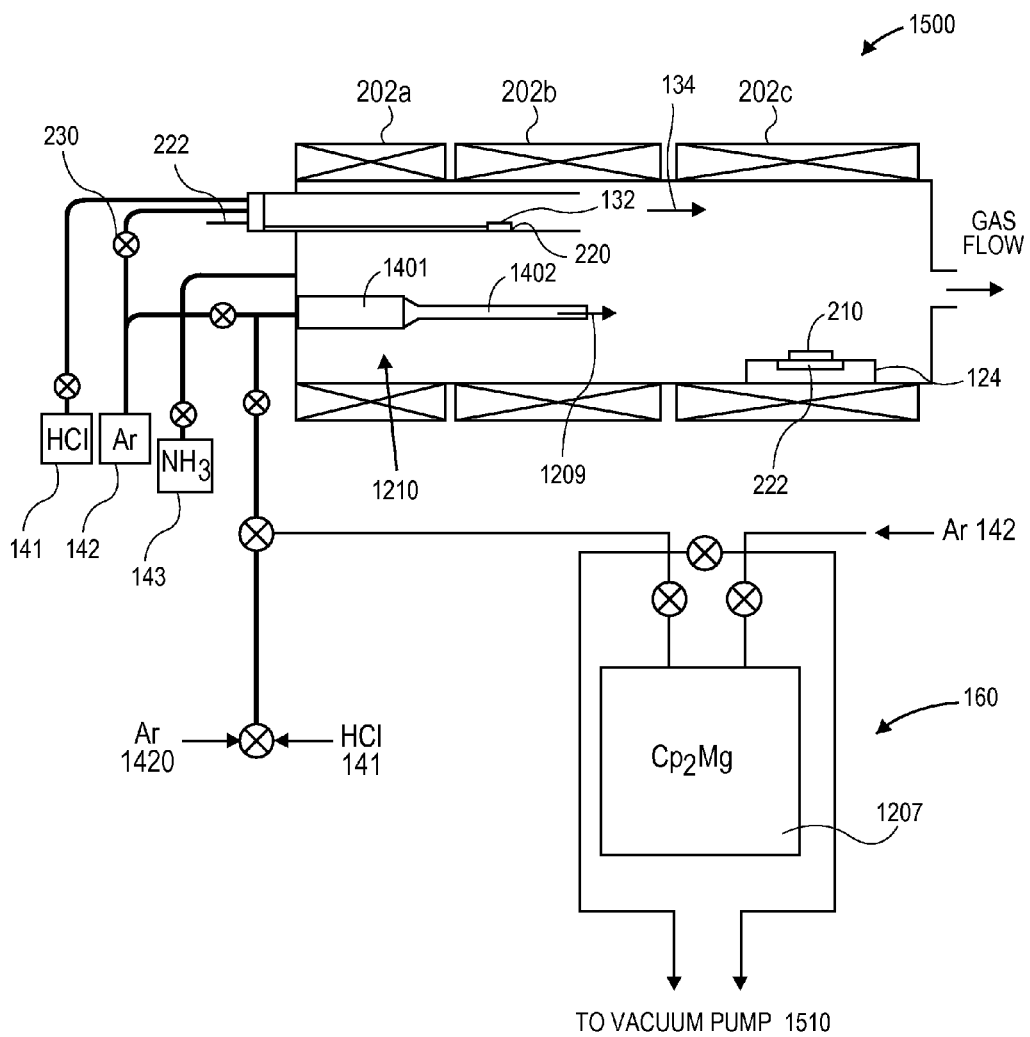
FIG. 15 is a schematic illustration of a HVPE reactor and one manner in which the external, non-metallic magnesium source shown in FIG. 14 can be constructed according to one embodiment.

FIG. 15 illustrates one embodiment of a HVPE reactor apparatus 1500 that includes an external Cp2Mg source 160 and a delivery tube 1210 having a reduced diameter section 1402 (as shown in FIG. 14). In the illustrated embodiment, HCl and Argon gases 141, 142 are provided for etching of the inner surface of the delivery tube 1210. More particularly, etching is performed by HCl 141, and Argon 142 is added to carry and dilute the HCl gas 141. A vacuum pump 1510 is used for evacuating oxygen-containing gases to prevent contamination and oxidation of the source 132

Figure 16:
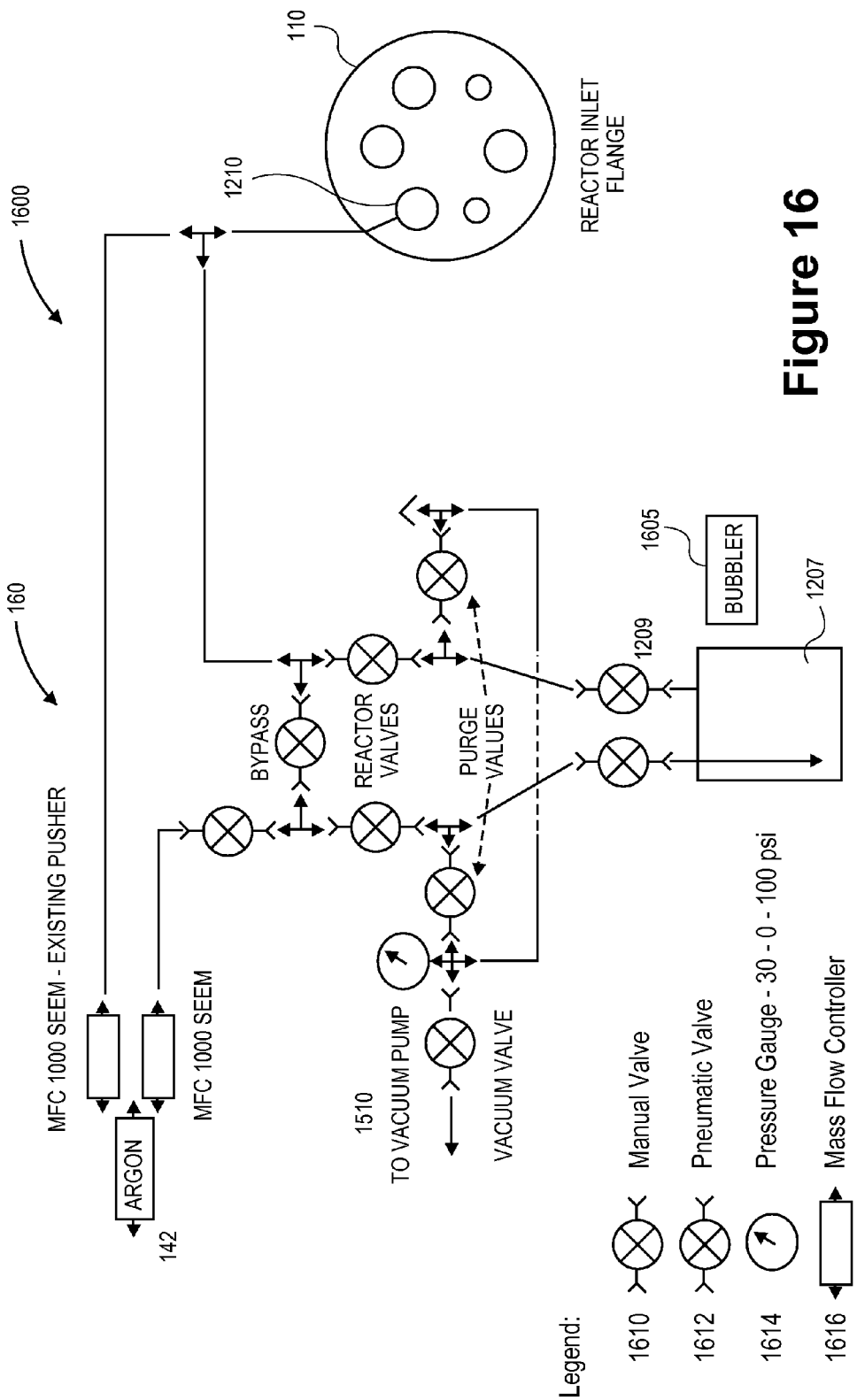
FIG. 16 is a schematic illustration of a HVPE reactor and another manner in which the external, non-metallic magnesium source shown in FIG. 14 can be constructed according to another embodiment.

FIG. 16 illustrates an external Cp2Mg source 160 and flow control system 1600 constructed according to one embodiment. The system 1600 includes a bubbler 1605 or other suitable vessel containing solid Cp2Mg 1207. Solid Cp2Mg 1207 evaporates to form a magnesium-containing gas 1209, which flows to the delivery tube 1210 using suitable valves and controllers, e.g., manual valves 1610 and pneumatic valves 1612, pressure gauges 1614 and mass flow controllers 1616.

FIGS. 17-20B illustrate embodiments of systems and methods of controlling growth of and focusing source materials, such as a gas containing gallium chloride 134, to control, direct or focus flows of source material gases onto the seed 122 to increase the source material efficiency and utilization, reduce parasitic deposition 600, reduce clogging of tubes such as the source tube 130 and ammonia 134 delivery tube, and increase the growth rate of group III single crystal gallium nitride 210.

Figure 17:
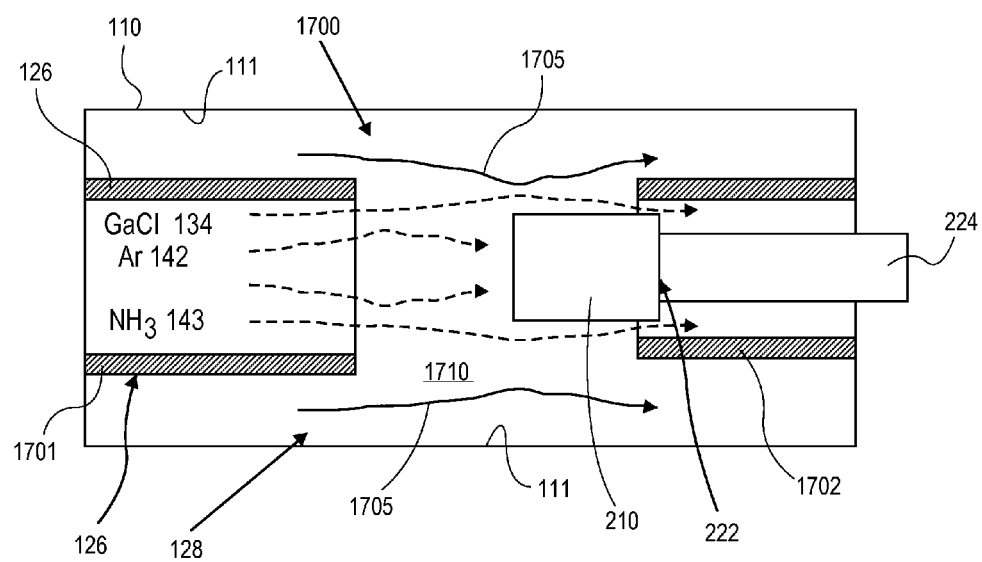
FIG. 17 is a schematic illustration of a gas focusing element or gas lens constructed according to one embodiment.

Referring to FIG. 17, according to one embodiment, a HVPE reactor includes a gas focusing element or "gas lens" 1700 (generally referred to as "gas focusing element" 1700). According to one embodiment, an inner tube 126 in the form of an active gas injection tube 1701 is positioned adjacent to a gas collection tube 1702. An intermediate space 1710 is defined between the gas injection and collection tubes 1701, 1702. Chemically active gases, e.g., gallium chloride 134 carried by Argon 142 and ammonia 143, flow through the injection tube 1701, through the intermediate space 1710 and on and around the seed 222 within the growth zone 112. Single crystal gallium nitride 210 is deposited on the seed 222, and active gases flow past the seed 222 and into the collection tube 1702 for evacuation.

According to one embodiment, the gas focusing element 1700 is formed by a protective gas 1705 that flows along the outer surfaces of the injection and collection tubes 1701, 1702. According to one embodiment, the protective gas is HCl gas 141, which forms a gas wall or barrier around the open space 1710 and between adjacent ends of the injection and collection tubes 1701, 1702. The protective gas 1705 blocks active gases (gallium chloride 134 and ammonia 143) from entering the intermediate space 1710 and contacting other internal components 120 inside of the reactor. The protective gas 1705 forms a gas focusing element or lens 1700 that focuses or restricts the direction that active gas flows between the tube 1701 and the collection tube 1702, thereby increasing the mass of source materials provided to the growth surface, thereby increasing the growth rate. The protective gas 1705 also reduces deposition of parasitic gallium nitride 600 on various internal components, e.g., around the seed 122 and on or around other internal components 120 including nozzles of source delivery tubes. In this manner, embodiments reduce or eliminate stresses and breaking of quartz materials and reduce or prevent growth rate reductions and clogging of various tubes. Gas focusing elements 1700 also allow larger quantities of source materials to be mixed in the growth zone 112 in the vicinity of the seed 122, thereby improving the efficiency at which source materials are supplied to the growth zone 112 and increasing the growth rate of single crystal gallium nitride 210. Gas focusing elements 1700 also protect the growing single crystal gallium nitride crystal 210 from HCl gas 141 that may damage the crystal 210 during cleaning of internal components 120 by gas etching.

Figure 18:
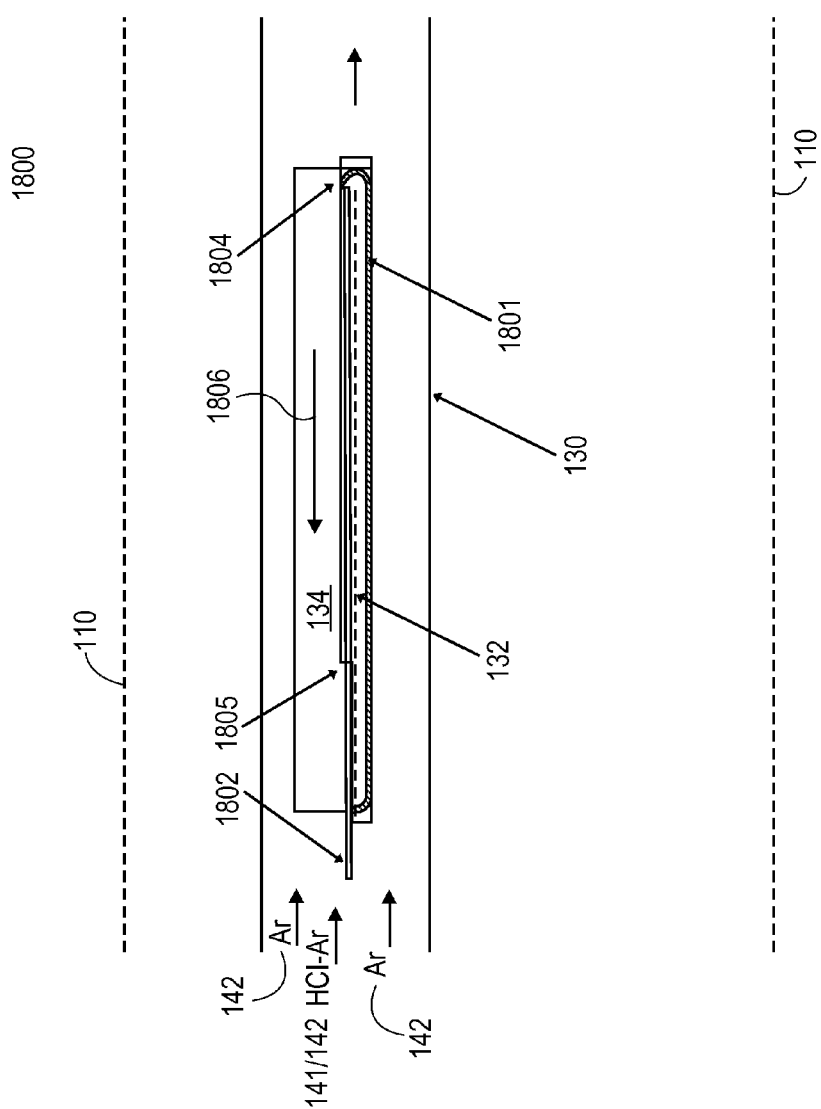
FIG. 18 is a schematic illustration of a source concentrating boat for use with HVPE reactors according to a further embodiment.

Referring to FIG. 18, another embodiment is directed to source concentrating boats or source concentrators 1800 (generally referred to as source concentrators 1800) that are used to control, direct or focus gases within source tubes 130 in order to increase the source material utilization and efficiency and increase growth rates of single crystal gallium nitride 210 on the seed 222 in the growth zone 112. In the illustrated embodiment, a source concentrator 1800 includes main body 1801 and an inlet tube 1802 that serves as an inlet for HCl gas 141. The length of the main body 1801 may be several centimeters to almost a meter, and the diameter of the main body 1801 may be about one to several centimeters.

In the illustrated embodiment, the HCl inlet tube 1802 extends along the length of the main body 1801, which contains gallium metal 132. During use, the inlet tube 1802 releases HCl gas 141 inside of the main body
through an outlet 1804, and the released HCl gas flows in a direction 1806 (indicated by arrow). As a result, the HCl gas 141 reacts with the gallium metal 132 to form gallium chloride 134, which is released from the boat 130 through an outlet 1805 and is carried towards the growth zone 112 by Argon gas 142. The reverse direction 1806 of HCl gas 141 over the gallium metal 132 advantageously improves the efficiency of the reaction between HCl gas 141 and the Ga melt 132 surface and also helps to increase the growth rate.

According to one embodiment, the size of outlet 1805 through which the gas containing gallium chloride 134 is released may be controllably altered during the growth process in order to controllably alter the supply of gas containing gallium chloride 134 to the growth zone 112 which, in turn, provides the ability to controllably alter the deposition rate of single crystal gallium nitride 210 on the seed 122. In one embodiment, the size of the outlet 1805 may be controllably altered between a closed position and an open position. An open outlet 1805 may have a diameter up to several square centimeters). According to one embodiment, this is accomplished by a cover (not shown) that can be positioned and moved over the outlet 1805 to increase and reduce the size of the outlet 1805 opening through which gases can flow.

FIGS. 19 and 20A-C illustrate embodiments of gas flow control components 1900, 2000 that are inserted into or placed within the source concentrator 1800 shown in FIG. 18. The unique geometry and flow control provided by inserts 1900 and 2000 prevent premature reaction between gallium chloride 134 and ammonia 143 and parasitic deposition 600 on the seed 122.

Figure 19:
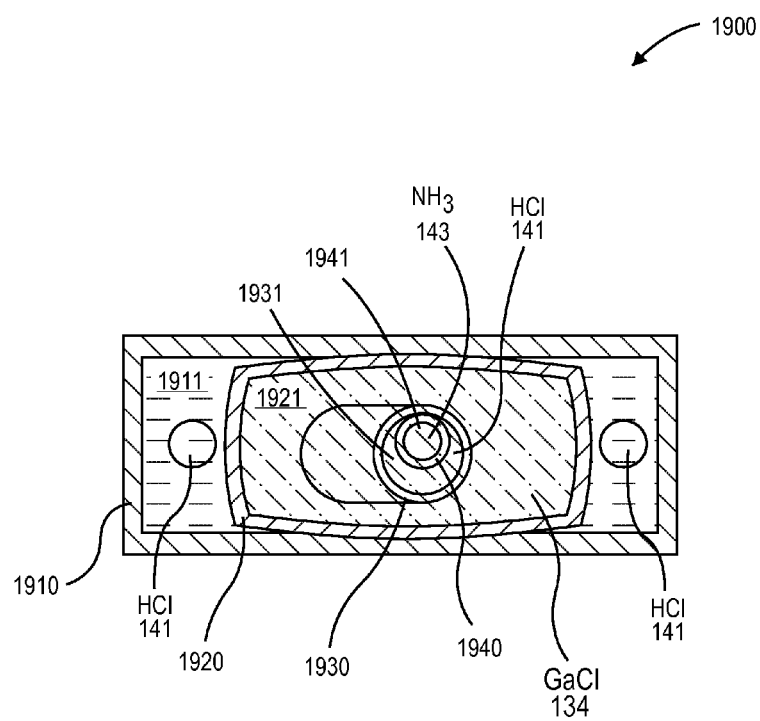
FIG. 19 illustrates a schematic illustration of a multi-tube insert for use with the source concentrator shown in FIG. 18 and configured to separate and focus flows of different gases through the source tube according to one embodiment.

More particularly, in the embodiment illustrated in FIG. 19, a gas flow control component or insert 1900 is a multi-tube structure that is configured such that certain gases flow through different tubes or different spaces defined by the tubes, and are then released from the flow control 1900 to the growth zone 112 where they can react with other active gases for growth of single crystal gallium chloride 210. In the illustrated embodiment, the flow control component 1900 includes four tubes: a first or outer tube 1910, a second tube 1920 positioned within the inner space 1911 defined by the first tube 1910, a third tube 1930 positioned within an inner space 1921 defined by the second tube 1920, and fourth tube 1940 positioned within an inner space 1931 defined by the third tube 1930.

In the illustrated embodiment, HCl gas 141 flows through the space 1911 or through a separate tube positioned within the space 1911. A gas carrying gallium chloride 134 flows through the space 1921. HCl gas 141 also flows through the space 1931, and ammonia 143 flows through the space 1941. With this configuration, flows of HCl gas 141, Argon 142/gallium chloride 134, and ammonia 143 are separated from each other as these gases flow through the flow control component 1900 and are then combined in the growth zone to react and form single crystal gallium nitride 210 on the seed 222.

With embodiments, HCl gas 141 flows are used to prevent deposition of parasitic material 600 on internal components 120, e.g., the inner surfaces of the first or outer tube 1910 and the inner surface of the third tube 1930, and to focus flow of Argon gas 142/gallium chloride 134 towards the seed 122. For example, HCl gas 141 flowing within the third tube 1930 cleans a nozzle of the fourth or ammonia delivery tube 1940 to prevent or reduce parasitic deposition 600. HCl gas 141 flows as shown in FIG. 19 also prevent premature reaction of ammonia 143 and gallium chloride 134 as a result of the arrangement of tubes 1920, 1930 and 1940, which separate ammonia 143 and gallium chloride 134 until the gases exit the outlets of the respective tubes and flow towards the growth zone 112. The cross-sectional area of a tube may, for example, be from about 1 mm$^2$ to several square centimeters, and the length of a tube may, for example, be from about 1 centimeter to more than 1 meter.

With the unique tubular geometry and resulting gas flows, embodiments effectively suppress parasitic deposition 600, extend the lifetime of internal components 120 and achieve longer growth durations with higher growth rates. Further, embodiments shown in FIG. 19 may be utilized with the flexible and elastic graphite cover member 150 to further suppress or control or manipulate parasitic deposition 600. For this purpose, the thickness of the graphite cover member 150 may be from about 0.1 mm to more than about one millimeter, and the size of the cover member 150 may be less than about 1 cm$^2$ for covering a small component to more than 1000 cm$^2$ for covering larger components.

FIG. 19 illustrates an embodiment of a gas flow control component or insert 1900 that includes a rectangular outer tube 1910 and circular inner tubes 1920, 1930 and 1940. Other embodiments of flow control components may include multiple tubes in different configurations. For example, referring to FIGS. 20A and 20B, a multi-tube structure 2000 constructed according to another embodiment may include four circular tubes 2010, 2020, 2030, 2040 arranged around a central axis 2005. The second tube 2020 is positioned within a space 2011 defined by the first tube 2010, the third tube 2030 is positioned within a space 2021 defined by the second tube 2020, and the fourth or innermost tube 2040 is positioned within a space 2031 defined by the third tube 2030.

Figure 20A:
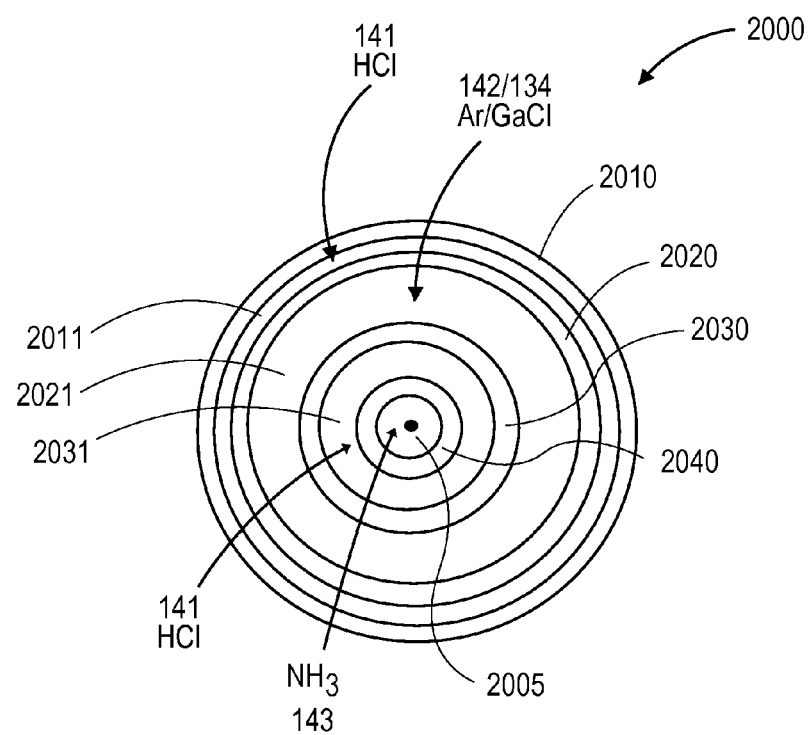
FIG. 20A is a schematic illustration of a cross-sectional view of a portion of a length of a multi-tube insert constructed according to another embodiment.
Figure 20B:
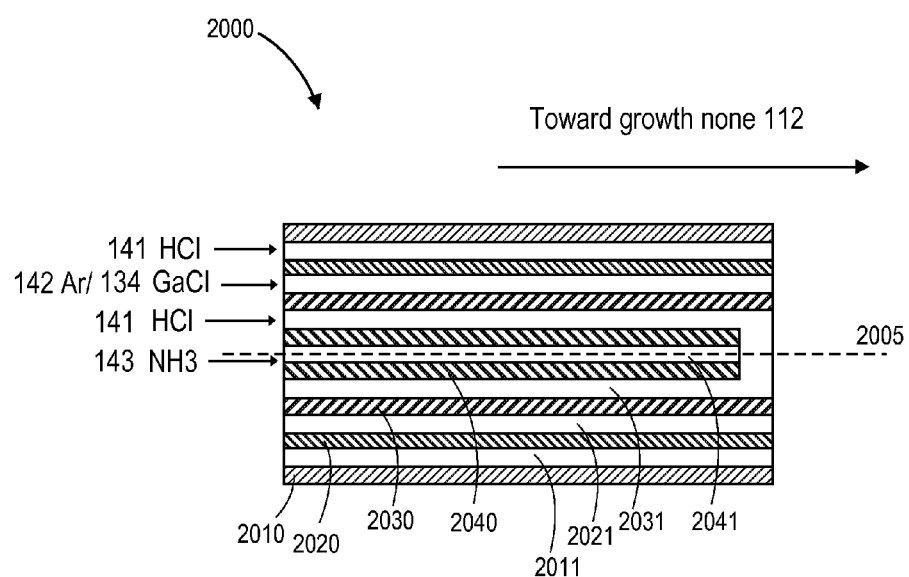
FIG. 20B is a schematic illustration of a cross-sectional view of FIG. 20A along line B-B.

Similar to the structural configuration shown in FIG. 19, the embodiment illustrated in FIGS. 20A and 20B are structured so that HCl gas 141 flows through the space 2011 defined by the first or outer tube 2010, Argon 142 and gallium chloride 134 generated by the reaction of gallium metal 132 and HCl gas 141 flows through the space 2021. HCl gas 141 also flows through the space 2031 of the third tube 2030, in which the fourth tube 1940 is positioned. Ammonia 143 flows through the space 2041 defined by the fourth tube 2040. With this configuration, flows of HCl gas 141, Argon 142/gallium chloride 134, and ammonia 143 are separated from each other as these gases flow through the flow control component 2000 and are then combined to react in the growth zone 112 to form gallium nitride 210 on the seed 222. According to one embodiment, the fourth tube 2040 that may carry ammonia 143 is shorter than the third tube 2030 such that the nozzle of the fourth tube 2040 may be surrounded by HCl 141 gas within the space 2031 to prevent nozzle clogging by parasitic deposits.

Reactor embodiments were utilized to grow various low defect density single crystal gallium nitride layers 210 at fast growth rates. Following is a summary of tests utilizing reactor apparatus and method embodiments described above. For growth with embodiments, suitable seeds or substrates 222 include a gallium nitride layer on a sapphire substrate. The gallium nitride layer may be relatively thin (e.g., about 1 to 15 microns) and have a low defect density that is an average total density of treading dislocations that is less than $10^8$ cm$^{-2}$, preferably less than $10^7$ cm$^{-2}$ and more preferably less than $10^6$ cm$^{-2}$). The uniformity of the thickness of the gallium nitride seed 122 may be better than 10%, and preferably less than 1%. The as-grown surface of the seed layer 122 may have a surface roughness (rms) of about 0.05 to 0.5 nm. The gallium nitride seed layer 122 may be undoped with a background impurity concentration less than $5 \times 10^{16}$ cm$^{-3}$ and oxygen and carbon atomic concentrations less than $5 \times 10^{16}$ cm$^{-3}$, preferably below $1 \times 10^{16}$ cm$^{-3}$. The gallium nitride seed layer 122 may be deposited directly on the sapphire or on a buffer layer such as an AlN/AlGaN/GaN multi-layer buffer including layers having thickness from about 1 to 50 nm. Such a structure may be used to control and minimize strain and defects in the seed layer 222.

For example, AlN/AlGaN super lattice structures may include AlN and AlGaN, e.g., from 10 to 90 mol. % of AlN, and the thickness of the layers may be about 1 to 100 nm and deposited as a buffer layer. The deposition temperature for this purpose may vary from 900 to 1100° C. Control of buffer composition/thickness and seed layer deposition parameters may allow control of bowing of the seed 222. For example, bowing of 2-inch seeds 222 may be controlled from about 10 to 70 microns, and the resulting shape of grown gallium nitride 210 can be controlled such that gallium nitride 210 wafers have desired concave and convex shapes can be grown.

During certain growth test, the sapphire seed 122 that was utilized had a diameter of about two inches, but seeds 122 having other diameters may be utilized, e.g., three inch, four inch and six inch sapphire seed substrates 122. The thickness of the sapphire seed 122 was about 440 microns, and may be about 0.2 mm to 3 mm and thicker as necessary. The surface orientation of sapphire of the seed 122 was 3 degrees off relative to the (0001) c-plane in in-direction.

During these growth tests, it was observed that certain misorientation angles produced the smoothest single crystal gallium nitride 210 surfaces at certain gallium nitride 210 deposition rates. For example, at a gallium nitride 210 deposition rate of about 1 micron per minute, the smoothest gallium nitride 210 layers were grown on sapphire seeds 122 with a misorientation angle of about 0.6 degree, whereas for a gallium nitride 210 deposition rate of about 20 microns per minute, smooth surfaces were observed on a sapphire seed 122 with a misorientation angle of about three degrees. Other crystallographic orientations, e.g., a-, r-, and m-plane seeds 122, may also be suitable for growth at various growth rates. Further, single crystal gallium nitride 210 may be grown for sufficient durations to form a boule, and the boule may also have a corresponding crystallographic orientation Gallium nitride boules 210 that were grown with embodiments had a length of about four millimeters and a diameter of about two inches. Grown boules were grown with growth durations of about 3.3 hours at a growth rate of about 1.2 mm/hr. The length of the gallium nitride 210 may vary to have lengths of several millimeters with different growth durations. For example, with reactor and method embodiments, a boule may be grown at a rate of about 20 microns per minute, i.e., greater than 1 millimeter per hour, and growth durations may exceed 100 hours. Further, embodiments were tested by growth of gallium nitride 210 on multiple seeds 122. Embodiments may be used for growth of single crystal gallium nitride 210 at fast growth rates on multiple seeds 122, e.g., more than six seeds 122, e.g., more than 12 seeds.

Single crystal gallium nitride 210 grown using reactor and method embodiments was single crystal 2H-GaN, as determined by x-ray diffraction analysis. The grown gallium nitride 210 materials did not contain parasitic inclusions. The as-grown surface of the gallium nitride crystal 210 was smooth and free of pits and other macro-defects. Reflection high-energy electron diffraction (RHEED) analysis was performed to demonstrate that the surface of the gallium nitride 210 was single crystalline. The top surface of the gallium nitride 210 had Ga polarity, and the defect density was below $10^7$ cm$^{-2}$ and embodiments may be utilized for even lower defect densities, e.g., below $10^6$ cm$^2$. For grown gallium nitride materials, 210, the full width at a half maximum (FWHM) of x-ray diffraction rocking curves measured in ω-scanning geometry was less than 300 arc seconds for both (00.2) and (10.2) GaN reflections. Background concentration Nd—Na for grown materials was in the range of $10^{15}$-$10^{17}$ cm$^{-3}$.

Although tests were conducted using gallium nitride to demonstrate HVPE reactor and method embodiments the same HVPE reactor configurations and methods may also be used to grow low defect density, single crystal layers and boules of other group III nitride materials including, for example, AlN and AlGaN. Further, grown materials may be doped to controllably provide GaN with n-type or p-type conductivity or semi insulating GaN.

Other tests also demonstrated effectiveness of embodiments. Desired material qualities were reflected in narrower widths of x-ray diffraction rocking curves. In this regard, x-ray rocking curve measurements can be performed for several x-ray diffraction reflections (peaks). Accepted reflections for group III nitride materials include the (00.2) symmetric and (10.2) asymmetric reflections based on ω-scan geometry. Improved material qualities were also reflected in improved surface roughness and defect densities measured using etch pit method.

More specifically, single crystal gallium nitride materials 210 were growth with the reactor and method embodiments in which a HVPE reactor was equipped with an atmospheric-pressure horizontal hot-wall quartz reactor and two-zone resistively heated furnaces. A gas-handling system based on electronic mass flow controllers (MFCs) was used to for distribution and control of gas flows inside of the reactor. Ammonia 143 and HCl 141 served as input active gases, and metallic Ga (7N) and Al (5N) were used as sources 132 of group III materials. The volume of the Ga and Al metallic sources was up to 2.5 kg and may be increased to 5 kg and more. Growth was performed at temperatures ranging from about 900° C. to 1100° C. Argon 142 served as a carrier gas for delivering gallium chloride 134 to the growth zone 112.

During a growth run, HCl gas 141 was passed over the Ga metal source 132, and the reaction between metallic Ga 132 and HCl 141 resulted in gallium chloride reaction product 134 that was transported by Argon gas 142 to the growth zone 112. In the growth zone 112, gallium chloride 134 was mixed with ammonia 143 resulting in deposition of single crystal gallium nitride 210 on the seed 122.

To increase the growth rate of gallium nitride 210, active gases (Argon 142/gallium chloride 134 and ammonia 143) were focused on the growing seed 122 surface utilizing the focusing element 1700 shown in FIG. 17. This was achieved by forming a "gas lens" of Argon gas 142 inside of the reactor tube. Faster growth rates were achieved by increasing the surface area of the Ga source 132 that reacts with the HCl gas 141 and increasing efficiency of the reaction. The total surface area of the Gallium metal source 132 exposed to HCl gas 141 was increased by increasing the number of Ga-containing boats 220 and increasing the open area of each boat 220. During these tests, 5-10 boats 220 were utilized, and the flow of HCl gas 141 was about 10 to 400 cm$^2$ for different numbers of boats 220. This test involved six channels or tubes 130 with Ga sources 132. Separate tubes 130 with HCl gas 141 were directed to points of intense parasitic deposition in the gas mixing zone, prior to the growth zone 112.

These HCl flows 141 served to reduce or eliminate the parasitic gallium nitride deposits 600. For example, HCl gas flows 141 focused on the inlet of the supply of ammonia 143 and prevented parasitic deposition 600 that would otherwise clog the supply tube and allowed the supply tube remain clean and flowing during long-term growth. Elastic graphite materials 150 (e.g., as described with reference to FIGS. 2-8) and graphite cartons were used to cover portions of internal quartz components 120 including seed holder 124 to prevent parasitic depositions on these internal components 120 and to prevent associated cracking (breakage) of these internal components 120. During growth of single crystal gallium nitride 120, the flow of HCl gas 141 was maintained at about 2.6 slm, the flow of ammonia gas 143 was maintained at about 6 slm and the flow of Argon gas 142 was maintained at about 18 slm.

The linear gas flow rate in the growth zone 112 was about 20 cm/sec. After one hour of growth using HVPE reactor embodiments, and operating parameters, single crystal gallium nitride material 210 having a thickness of 1.4 mm was achieved representing a growth rate of 1.4 mm per hour, which is higher than known HVPE systems.

Further, for the gallium nitride material grown at this growth rate. The x-ray diffraction rocking curve width (FWHM) for ω-scanning measurements was about 100 to 400 arc seconds for the (00.2) GaN reflection and about 90 to 450 arc seconds for the (10.2) GaN reflections. The dislocation density of the grown gallium nitride 210 was from $10^4$ to $10^6$ $cm^{-2}$, and the grown gallium nitride 210 materials had mirror like surface. The surface roughness of the grown material 210, measured by atomic force microscopy using 5×5 μm² scans, was about 0.5 to 5 nm. The background Nd—Na concentration measured on gallium nitride 210 surface using a mercury probe was about $1.5 \times 10^{17}$ to $9 \times 10^{17}$ $cm^{-3}$. Embodiments demonstrated stable growth on a large area substrate holder 124 that held four two-inch seeds 122. No inclusions were detected in the grown gallium nitride 210 materials.

Other grown gallium nitride materials 210 had a full width at half maximum (FWHM) of an w-scan x-ray rocking curve for grown gallium nitride was less than 500 arc seconds for the (10.2) peak and less than 300 arc seconds for a (00.2) peak and grown with a deposition rate exceeding 17 microns per minute. The resulting low defect density materials had dislocation densities less than $10^4$ to $10^7$ $cm^{-2}$ and were grown at growth rates greater than 1 mm/hr, greater than 2 mm/hr and greater than 5 mm/hr. The thickness across the grown materials were uniform and varied by less than 1%, less than 5% and less than 10%, respectively. Additionally, material parameters including resistivity and optical transmission varied by less than 2-3%. Grown materials also exhibited uniform doping, which varied by less than 10%. The surface roughness of materials grown at rates greater than 1 mm/hour were confirmed to be better than 1 nm for a 5×5 atomic force microscopy scan. It was also confirmed that the materials that were grown were single crystal materials and did not include inclusions (e.g., due to parasitic deposition).

A similar method was applied to demonstrate growth of aluminum nitride using a metallic aluminum source. Further, growth of aluminum gallium nitride was demonstrated using both of gallium and aluminum meal sources. Commercial 2-inch, 3-inch, and 4-inch (100 mm) SiC and sapphire wafers were used as seed substrates 122. For growth of AlGaN, HCl gas was passed separately over the Ga and Al metal sources, and the gallium and aluminum chlorides were carried by Argon gas 142 to the growth zone 112 where they were mixed with ammonia 143, providing deposition of AlGaN solid solution layers on the seed 122. In the grown materials, the [Al]/[Al]+[Ga] ratio in vapour phase determined AlGaN alloy composition.

Further tests demonstrated the effectiveness of HVPE reactor and method embodiments by growth of p-type bulk single crystal gallium nitride 210 as described with reference to FIGS. 12-16. Prior to doping, HCl 141 etching was used to eliminate magnesium memory effect on inner surfaces of internal components 120 including the tube 1210 that delivers a magnesium-containing gas to the growth zone 112.

Magnesium impurities were supplied from and external Cp2Mg source 160. Thick single crystal p-type gallium nitride materials 210 were grown and had Na—Nd concentrations exceeding $5 \times 10^{19}$ $cm^{-3}$, atomic Mg concentrations greater than $10^{20}$ $cm^{-3}$ and hole carrier concentrations at room temperature greater than $6 \times 10^{18}$ $cm^{-3}$. Hole mobility for grown materials ranged from 10 to 80 $cm^2/Vsec$ at 300 K as measured by the Hall method. Control of p-type doping within a range of doping parameters, e.g., from about $10^{16}$ to $10^{19}$ $cm^{-3}$ was demonstrated by changing Argon gas 142 flows through the vessel holding the Cp2Mg 1207 and/or the magnesium-containing gas delivery tube 1210.

These tests demonstrated growth of p-type single crystal gallium nitride 210 having a thickness or length ranging from several microns (e.g. about 0.1 to about 10 microns) to several millimeters (e.g., about 1 to about 4 mm) at high growth rates from about 1 micron per minute to more than 1 millimeter per hour, and even greater than 2 millimeters per hour, while maintaining low defect densities (e.g., about $10^6$-$10^8$ $cm^{-2}$). Such capabilities were also demonstrated for long growth durations (e.g., more than 100 hours). P-type GaN wafers were fabricated after separation of grown GaN materials 210 from the seed 122.

Dopant variations were less than 5%, and inverted domains, which are typical crystal defects within gallium nitride that is doped using $Cp_2Mg$ during MOCVD growth, were not observed. Grown gallium nitride 210 layers had smooth as-grown surface with rms roughness less than 1 nm measured by atomic force microscopy. RHEED characterization of the grown materials demonstrated that the as-grown surface is single crystalline. X-ray diffraction confirmed that the entire grown p-type gallium nitride was single crystal. It was observed that for grown p-type materials 210, background impurity concentrations, including carbon background concentrations, were as low as background impurity concentrations in undoped GaN materials. Further, the hydrogen background atomic concentration was typically was several times (e.g., >10×) less than magnesium atomic concentrations.

GaN materials 210 with sharp doping interfaces were grown, and the background concentration of an undoped GaN layer grown after highly Mg-doped layer in the same HVPE epitaxial process was in the $10^{16}$ $cm^{-3}$ range.

HVPE reactor and method embodiments may also be used to fabricate a GaN pn structures. For example, embodiments may also be applied to fabricate AlGaN and InGaN pn structures.

Grown structures utilized embodiments include thick single crystal gallium nitride 210 layers having controlled n-type doping and p-type doping. N-type doping may be performed using donor impurity, e.g., silicon. Similar processes may be done using other donor impurity such as oxygen, germanium and others.

To fabricate a structure, a first silicon doped n-type GaN layer having a thickness of about 12 microns may be grown on a seed 122, e.g., a 4-inch sapphire with c-plane orientation and tilt angle of 0.6 degrees toward m-crystallographic direction. Other substrates such as Si, SiC, GaN, AlN and others may be also used. Two wafers were loaded at the same time. Low defect gallium nitride seeds 122 with a dislocation density less than $10^6$ $cm^{-2}$ are preferable and less than $10^4$ $cm^{-2}$ are more preferred. A gallium nitride layer 210 may be grown with at a deposition rate of 5 microns per minute. Doping concentration Nd—Na in the silicon doped layer may be about $5 \times 10^{18}$ $cm^{-3}$. This single crystal gallium nitride layer 210 may be formed to ensure low electrical resistivity of grown gallium nitride material. Other doping concentrations may be used still producing gallium nitride with low enough electrical resistivity. Doping reduction measurements may be acquired in situ to reduce dislocation density in grown layers.

When growth of this layer is completed, Si-containing gas flow may be reduced to grow a gallium nitride low doped region. Si doping concentrations can be controlled to ensure required reverse breakdown voltage of the pn structure. For example, for a reverse breakdown voltage of 10,000 V, the doping concentration can be Nd—Na of $5\times10^{15}$ cm$^{-3}$ or lower values. The thickness of a low doped gallium nitride layer 210 may be controlled to withstand high voltage operation of the pn structure. For example, for 10,000 V pn structure, the thickness of the gallium nitride layer 210 may be about 100 microns, and the growth rate may be about 2 microns per minute. However, other growth rates may be used, e.g., about 1 to 20 microns per minute.

When a low doped GaN layer of sufficient thickness is reached, epitaxial wafers may be removed from the growth zone 112 to a growth interruption zone, and a p-type doping impurity may be introduced into the growth zone 112. One suitable p-type doping impurity is an external $Cp_2Mg$ source 1207, as described with reference to FIG. 12, or p-type doping. Gallium nitride materials 210 that are doped with magnesium with embodiments can have a Na—Nd concentration of about $10^{19}$ cm$^{-3}$. P-type gallium nitride layers 210 may be grown with a growth rate that is controlled to be from about 0.01 to about 20 microns per minute. The thickness of grown gallium nitride 210 layers may be varied from 0.005 to 1000 microns. The surface roughness of grown structures, rms, is expected to be below 2 nm. The crystalline quality of grown gallium nitride 210 layers corresponds to the properties of gallium nitride layers described in previous embodiments. The thickness and doping uniformity are expected to be less than 10%. As a result, gallium nitride 210 epitaxial wafers with pn structures and a high breakdown voltage may be fabricated.

Magnesium doped gallium nitride materials 210 that were grown using HVPE reactor and method embodiments exhibit p-type conductivity. In most cases, no activation of acceptor impurity was used to form pn structure. Low resistivity Ohmic contacts were deposited top-type and n-type regions of the pn structures. The contacts were formed using e-beam metal evaporation in a high (better than $10^{-6}$ Torr) vacuum. The contact resistivity was determined to be below $10^{-3}$ Ohm cm$^2$ and $10^{-6}$ Ohm cm$^2$ for respective p-type and n-type contacts to ensure low forward voltage drops for the diodes. Ni-based, Au-based, and Pt-based Ohmic contact metallizations were used. Mesa structures with a size from $10^{-5}$ cm$^{-2}$ to several square centimeters were fabricated using reactive ion etching. Ar-based, Fl-based and Cl-based plasmas were used for reactive ion etching. Reverse voltage of fabricated structures varied from $10^2$ to $10^3$ V depending on material doping and thickness. Pn structures having a reverse voltage exceeding $10^4$ V may be grown by this approach. Higher operating voltages may be obtained using lower doped, thicker gallium nitride. The electric breakdown of fabricated structures had avalanche characteristics. The electric breakdown field was measured from 2.5 to 3.5 MV/cm. Leakage currents of fabricated structures were less than $10^{-6}$ to $10^{-9}$ A for reverse voltages less than $0.9\times Vb$, where Vb is a breakdown voltage. Surface protecting layers (field plates) were used to increase the breakdown voltage of the diodes. HVPE grown aluminum nitride, Si3N4 and other insulating layers may be used for mesa side wall protection. The turn-on voltage for gallium nitride pn junctions that were grown were about 2.8 V. The forward current at a forward voltage of 2 V was below $10^{-6}$ A, and may preferably be below $10^{-9}$ A.

Electro luminescence was observed when the diodes were operating at forward voltage exceeding 3 V. The color of the luminescence was determined by the radiative recombination processes in the light-emitting region of the pn structure ranged from ultraviolet to red. If the thickness of the light emitting region was sufficiently thin (typically thinner than 10 nm), quantum effect related recombination was observed in photo- and electro-luminescence spectra.

Although HVPE reactor and method embodiments are described with reference to GaN pn structures, embodiments may also be used to fabricate other pn structures including, but limited to, GaN/AlGaN, InGaN/GaN, and InGaN/AlGaN pn structures. Further, the same HVPE reactor and method embodiments may be applied to fabricate high voltage pn structures having several hetero junctions and pn-junctions, for example N-p-N, P-n-P, or N-p-n-P structures (for example p-AlGaN/n-GaN/-p-InGaN/-n-AlGaN). Low doped regions of pn structures fabricated with embodiments may have n-type or p-type conductivity.

Although particular embodiments have been shown and described, it should be understood that the above discussion is not intended to limit the scope of these embodiments. Various changes and modifications may be made without departing from the scope of the claims.

For example, it should be understood that the flexible cover member, such as a graphite sheet, may be capable of multiple uses depending on which internal components are covered. For example, there may be instances when the flexible cover member is use to receive parasitic deposition of group III nitride material. There may be other times when there is no parasitic deposition, but the flexible member protects internal components from chemically active substances such as chemically active gases. Further, there may be other times when the flexible member is used to both receive parasitic deposition and also protect internal components from chemically active substances. The use the flexible member may depend on, for example, the location within the reactor of the flexible member, the stage of HVPE processing, and the substances, chemicals or gases that are utilized.

As a further example, it should be understood that embodiments may be implemented within vertical and horizontal reactors, and the seed upon which single crystal group III nitride materials are grown may be positioned parallel to or perpendicular to gas flow. Further, although various figures illustrate a reactor and a single seed, it should be understood that embodiments can be implemented using multiple seeds and substrates, for simultaneously growth of multiple crystals.

Additionally, although the structure and functionality of embodiments are described individually and certain embodiments are described in combination with other embodiments, it should be understood that embodiments may be used individually or in combination with one or more other embodiments depending on the system configuration utilized and processing needs. For example, HVPE apparatus and method embodiments may involve a cover member, such as graphite felt or paper cover member, and an external non-metallic magnesium dopant source.

A cover member may also be used in combination with embodiments that involve exchanging or replacing one or more internal components or the cover member, e.g., after parasitic deposition of material. Embodiments may also involve use of a cover member in combination with a gas focusing element or lens for preventing flow of reactive gases to an inner surface of a main reactor tube. Embodiments may also involve an external non-metallic source and a gas focusing lens. Moreover, in another embodiment, a HVPE apparatus utilizes a cover member, an external non-metallic magnesium source and a focusing element or lens. The structural configurations described above show how embodiments may be implemented. It should be understood, however, that other combinations of components of embodiments may be utilized for different applications.

Embodiments may also be utilized for growth of various group III nitride materials including, but not limited to, AlN, AlGaN, InN and InGaN, and that various other impurities other than magnesium may be utilized for doping including, but not limited to, zinc and iron. Further, materials grown using embodiments may be n-type and p-type materials.

Although embodiments are described with reference to a GaN material, embodiments can also be utilized to fabricate a semiconductor structure including multiple layers.

Thus, embodiments are intended to cover alternatives, modifications, and equivalents that may fall within the scope of the claims.

What is claimed is:

1. A method of growing a p-type group III nitride material by HVPE, comprising:
    delivering a reaction product and a reactive gas to a growth zone inside of a HVPE reactor tube;
    delivering evaporated Cp2Mg from outside of the HVPE reactor tube and into the growth zone; and
    growing the p-type group III nitride material by a reaction of the reaction product and the reactive gas in the presence of the evaporated Cp2Mg in the growth zone.

2. The method of claim 1, wherein the reaction product is GaCl or AlCl3, and an as-grown p-type group III nitride material has concentration Na—Nd greater than $10^{19}$ cm$^{-3}$.

3. The method of claim 1, wherein the p-type group III nitride material is p-type GaN, p-type AlGaN or p-type InGaN.

4. The method of claim 1, wherein the reactive gas is ammonia.

5. The method of claim 1, wherein the p-type group III nitride material is grown at a rate of at least 1 millimeter per hour.

6. A method of growing a p-type group III nitride material by HVPE, comprising:
    positioning a gallium metal source within a source tube inside of a reactor tube;
    supplying a first reactive gas comprising a reactive halide gas to the source tube such that the gallium metal source and the reactive halide gas react to form a reaction product;
    supplying a carrier gas to the source tube to deliver the reaction product to a growth zone inside of the reactor;
    supplying a second reactive gas to the growth zone;
    supplying a magnesium-containing gas to the growth zone, wherein the magnesium of the magnesium-containing gas is from an external Cp2Mg source; and
    growing the p-type group III nitride material as a result of a reaction of the reaction product and the second reactive gas in the presence of the magnesium-containing gas.

7. The method of claim 6, wherein the reaction product is GaCl or AlCl$_3$.

8. The method of claim 6, wherein the p-type group III nitride material is p-type GaN, p-type AlGaN or p-type InGaN.

9. The method of claim 6, wherein the first reactive gas is HCl, and the second reactive gas is NH$_3$.

10. The method of claim 7, wherein the p-type group III nitride material is grown at a rate of at least 1 millimeter per hour.

11. A method of growing a p-type single crystal group III nitride material by HVPE, comprising:
    positioning a plurality of components in a reactor tube, the plurality of components including a seed holder and a seed supported by the seed holder;
    covering at least a portion of one or more components with a flexible cover member;
    delivering a reaction product to the growth zone, the reaction product resulting from a reaction of a gallium metal source and a first reactive gas;
    delivering a second reactive gas to the growth zone;
    delivering a gas having a magnesium compound from outside of the HVPE reactor tube and into the growth zone; and
    growing the p-type single crystal group III nitride material as a result of a reaction of the reaction product and the second reactive gas in the growth zone in the presence of the gas having the magnesium compound.

12. The method of claim 11, wherein the p-type single crystal group III nitride material is grown at a rate of at least 1 millimeter per hour.

* * * * *